US010840296B2

(12) United States Patent
Rosenblatt et al.

(10) Patent No.: US 10,840,296 B2
(45) Date of Patent: Nov. 17, 2020

(54) THREE-DIMENSIONAL INTEGRATION FOR QUBITS ON CRYSTALLINE DIELECTRIC

(71) Applicant: International Business Machines Corporation, Armonk, NY (US)

(72) Inventors: Sami Rosenblatt, White Plains, NY (US); Rasit Onur Topaloglu, Poughkeepsie, NY (US); Markus Brink, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/673,309

(22) Filed: Nov. 4, 2019

(65) Prior Publication Data
US 2020/0335550 A1  Oct. 22, 2020

Related U.S. Application Data

(63) Continuation of application No. 15/989,925, filed on May 25, 2018, now Pat. No. 10,497,746.

(51) Int. Cl.
*H01L 27/18* (2006.01)
*G06N 10/00* (2019.01)
(Continued)

(52) U.S. Cl.
CPC ............ *H01L 27/18* (2013.01); *G06N 10/00* (2019.01); *H01L 39/2493* (2013.01); *H01L 39/025* (2013.01); *H01L 39/223* (2013.01)

(58) Field of Classification Search
CPC ... H01L 27/18; H01L 39/2493; H01L 39/223; H01L 39/025; G06N 10/00
See application file for complete search history.

(56) References Cited

U.S. PATENT DOCUMENTS 6,355,501 B1   3/2002   Fung et al.
6,534,381 B2   3/2003   Cheung et al.
(Continued)

FOREIGN PATENT DOCUMENTS

WO   2014/163728 A2   10/2014
WO   2017/116442 A1   7/2017
(Continued)

OTHER PUBLICATIONS

List of IBM Patents or Applications Treated as Related.
(Continued)

*Primary Examiner* — Matthew L Reames
(74) *Attorney, Agent, or Firm* — Amin, Turocy & Watson, LLP

(57) ABSTRACT

Techniques related to a three-dimensional integration for qubits on crystalline dielectric and method of fabricating the same are provided. A superconductor structure can comprise a first wafer comprising a first crystalline silicon layer attached to a first patterned superconducting layer, and a second wafer comprising a second crystalline silicon layer attached to a second patterned superconducting layer. The second patterned superconducting layer of the second wafer can be attached to the first patterned superconducting layer of the first wafer. A buried layer can comprise the first patterned superconducting layer and the second patterned superconducting layer. The buried layer can comprise one or more circuits. The superconductor structure can also comprise a transmon qubit that can comprise a Josephson junction and one or more capacitor pads comprising superconducting material. The Josephson junction can comprise a first superconductor contact, a tunnel barrier layer, and a second superconductor contact.

20 Claims, 25 Drawing Sheets

(51) Int. Cl.
*H01L 39/24* (2006.01)
*H01L 39/22* (2006.01)
*H01L 39/02* (2006.01)

(56) References Cited

U.S. PATENT DOCUMENTS

| | | | |
|---|---|---|---|
| 9,397,283 | B2 | 7/2016 | Abraham et al. |
| 9,412,736 | B2 | 8/2016 | Ding et al. |
| 9,520,547 | B2 | 12/2016 | Abraham et al. |
| 9,524,470 | B1 | 12/2016 | Chow et al. |
| 9,836,699 | B1 | 12/2017 | Rigetti et al. |
| 10,497,746 | B1 * | 12/2019 | Rosenblatt ............ H01L 39/045 |
| 10,505,096 | B1 | 12/2019 | Rosenblatt et al. |
| 2008/0032501 | A1 | 2/2008 | Klein et al. |
| 2015/0372217 | A1 | 12/2015 | Schoelkopf, III et al. |
| 2016/0292587 | A1 | 10/2016 | Rigetti et al. |
| 2018/0012932 | A1 | 1/2018 | Oliver et al. |
| 2018/0013052 | A1 | 1/2018 | Oliver et al. |
| 2019/0027672 | A1 | 1/2019 | Megrant et al. |

FOREIGN PATENT DOCUMENTS

| | | |
|---|---|---|
| WO | 2017/155531 A1 | 9/2017 |
| WO | 2017/217961 A1 | 12/2017 |
| WO | 2018/030977 A1 | 2/2018 |

OTHER PUBLICATIONS

Mantl, Siegfried, "Compound Formation by Ion Beam Synthesis and a Comparison With Alternative Methods Such as Deposition and Growth or Wafer Bonding", Nuclear Instruments and Methods in Physics Research B 106, 1995, pp. 355-363.
Brecht et al., "Micromachined Integrated Quantum Circuit Containing a Superconducting Qubit", Physical Review Applied U.S. Pat. No. 7,044,018, 2017, American Physical Society, 6 pages.
Non-Final Office Action received for U.S. Appl. No. 15/989,873 dated Mar. 15, 2019, 29 pages.
Non-Final Office Action received for U.S. Appl. No. 15/989,925 dated Mar. 15, 2019, 24 pages.
International Search Report and Written Opinion received for PCT Application Serial No. PCT/EP2019/062908 dated Aug. 12, 2019, 16 pages.
International Search Report and Written Opinion received for PCT Application Serial No. PCT/EP2019/062976 dated Aug. 9, 2019, 15 pages.
Non-Final Office Action received for U.S. Appl. No. 16/673,222 dated Jul. 31, 2020, 16 pages.

* cited by examiner

THREE-DIMENSIONAL INTEGRATION FOR QUBITS ON CRYSTALLINE DIELECTRIC

BACKGROUND

The subject embodiments of the invention relate to superconducting devices, and more specifically, to quantum information devices and methods of fabricating the same. For previously proposed vertical Josephson junctions, only a thin silicon layer operates efficiently. However, having a thin silicon layer increases coupling across circuit layers on opposite sides of the thin silicon layer surfaces. Therefore, use of a thin or a thick layer of silicon will depend on the application. In some cases, there should be both a vertical Josephson junction and a free configuration of interconnections among them.

In addition, when using Silicon-on-Metal (SOM) wafers, it is not possible to remove a bottom superconductor layer while keeping a top superconductor layer. Instead, either both layers are removed, or only the top layer is removed using a standard etch process. If the bottom layer is removed, then filled with dielectric, and a top superconductor layer is deposited, this can increase the loss tangent, which is not preferred in quantum computing applications. However, configurations where a bottom superconductor layer is missing and a top superconductor layer exists are utilized for various circuitry.

For example, Megrant (WO Patent Application 2017116442 A1) discusses that "[a] first wafer [ ] and [a] second wafer [ ] are joined (e.g., bonded) together (506), as shown in the example of FIG. 1C to form a wafer stack." See paragraph [0035]. "The second wafer [ ] is prepared in the same manner as the first wafer [ ] and includes a substrate [ ], an insulator layer [ ], a single crystalline dielectric layer [ ], and a superconductor layer [ ]." See id. In Megrant, however, there is no means to access the bottom layer and, therefore, the bottom layer does not comprise circuitry.

SUMMARY

The following presents a summary to provide a basic understanding of one or more embodiments of the invention. This summary is not intended to identify key or critical elements or delineate any scope of the particular embodiments or any scope of the claims. Its sole purpose is to present concepts in a simplified form as a prelude to the more detailed description that is presented later. In one or more embodiments described herein, systems, computer-implemented methods, methods, apparatuses, devices, and/or computer program products that facilitate three-dimensional integration for qubits on crystalline dielectric are provided.

According to an embodiment, a superconductor structure can comprise a first wafer comprising a first crystalline silicon layer attached to a first patterned superconducting layer. The superconductor structure can also comprise a second wafer comprising a second crystalline silicon layer attached to a second patterned superconducting layer. The second patterned superconducting layer of the second wafer can be attached to the first patterned superconducting layer of the first wafer. A buried layer can comprise the first patterned superconducting layer and the second patterned superconducting layer. The buried layer can comprise one or more circuits. The superconductor structure can also comprise a transmon qubit that can comprise a Josephson junction and one or more capacitor pads comprising superconducting material. The Josephson junction can comprise a first superconductor contact, a tunnel barrier layer, and a second superconductor contact. The buried layer that comprises prepatterned wafers can enable full control of a waveguide design in the patterned layer.

In an implementation, the first patterned superconducting layer can comprise a first pattern and the second patterned superconducting layer can comprise a second pattern that mirrors the first pattern. According to an alternative implementation, the first patterned superconducting layer can comprise a first pattern and the second patterned superconducting layer can comprise a second pattern different than the first pattern. The patterns (e.g., the first pattern, the second pattern) can facilitate placement of one or more circuits in the buried layer.

In accordance with some implementations, the transmon qubit can comprise a vertical Josephson junction. According to some implementations, the transmon qubit is a first transmon qubit and the superconductor structure can comprise a second transmon qubit. The first transmon qubit can comprise a planar Josephson junction and the second transmon qubit can comprise a vertical Josephson junction.

According to some implementations, the superconductor structure can comprise a surface superconducting layer over at least a portion of the second wafer. Further to these implementations, the superconductor structure also can comprise a through silicon via between the surface superconducting layer and the buried layer.

In an implementation, the superconductor structure can comprise a surface superconducting layer over at least a portion of the second wafer. Further to this implementation, the superconductor structure can comprise a partial via in the second crystalline silicon layer. The partial via can comprise a capacitive connection with the buried layer.

In accordance with an implementation, the one or more capacitor pads can be located on a surface of the superconductor structure. According to another implementation, the one or more capacitor pads can be filled vias located within the second crystalline silicon layer.

According to a further implementation, the superconducting material can be a first superconducting material. The superconductor structure can comprise a second superconducting material over the second crystalline silicon layer. In addition, one or more circuits can be formed in the second superconducting material.

According to another embodiment, a method can comprise etching a first superconducting layer of a first wafer into a first patterned superconducting layer, and a second superconducting layer of a second wafer into a second patterned superconducting layer. The first wafer can comprise a first crystalline silicon layer attached to the first patterned superconducting layer. The second wafer can comprise a second crystalline silicon layer attached to the second patterned superconducting layer. The method can also comprise creating a buried layer based on attaching the first patterned superconducting layer and the second patterned superconducting layer. Further, the method can comprise forming a transmon qubit comprising a Josephson junction and one or more capacitor pads that comprise superconducting material. The Josephson junction can comprise a first superconductor contact, a tunnel barrier layer, and a second superconductor contact. By patterning the superconducting layers prior to the bonding of the wafers, a Silicon-on-Metal (SOM) substrate can be created with a buried superconducting circuit.

In accordance with an implementation, etching the first superconducting layer can comprise etching the first superconducting layer with a first pattern. In addition, etching the second superconducting layer can comprise etching the second superconducting layer with a second pattern.

In some implementations, forming the transmon qubit can comprise forming a qubit comprising one or more vertical Josephson junctions in the second crystalline silicon layer. In additional, or alternative implementations, forming the transmon qubit can comprise forming a first transmon qubit on a top surface of the second wafer. The first transmon qubit can comprise a planar Josephson junction and the method can comprise forming a second qubit comprising a vertical Josephson junction in the second crystalline silicon layer.

According to some implementations, the method can comprise depositing a surface superconducting layer over the second wafer. The method can also comprise forming one or more vias between the surface superconducting layer and the buried layer.

In some implementations, the method can comprise depositing a surface superconducting layer over the second wafer. The method can also comprise forming a partial via in the second crystalline silicon layer. The partial via can comprise a capacitive connection with the buried layer.

In accordance with some implementations, forming the one or more capacitor pads can comprise etching one or more vias in the second crystalline silicon layer and filling the one or more vias with a first superconducting material.

The method can also comprise, according to some implementations, depositing a second superconducting material over the second crystalline silicon layer. The method can also comprise forming one or more circuits in the second superconducting material.

According to a further embodiment, a quantum information device can comprise a first wafer comprising a first crystalline silicon layer attached to a first patterned superconducting layer. The quantum information device can also comprise a second wafer comprising a second crystalline silicon layer attached to a second patterned superconducting layer. The second patterned superconducting layer of the second wafer can be attached to the first patterned superconducting layer of the first wafer. Further, a buried layer can comprise the first patterned superconducting layer and the second patterned superconducting layer. The buried layer can comprise a circuit. In addition, the quantum information device can comprise a transmon qubit comprising a Josephson junction and one or more capacitor pads comprising superconducting material. The Josephson junction can comprise a first superconductor contact, a tunnel barrier layer, and a second superconductor contact.

In accordance with an implementation, the first patterned superconducting layer can comprise a first pattern and the second patterned superconducting layer can comprise a second pattern that mirrors the first pattern. Alternatively, or additionally, the first patterned superconducting layer can comprise a first pattern and the second patterned superconducting layer can comprise a second pattern that is different from the first pattern.

According to yet another embodiment, a superconductor structure can comprise a first wafer comprising a first crystalline silicon layer attached to a first patterned superconducting layer. The superconductor structure can also comprise a second wafer comprising a second crystalline silicon layer attached to a second patterned superconducting layer. The second patterned superconducting layer of the second wafer can be attached to the first patterned superconducting layer of the first wafer. A buried layer can comprise the first patterned superconducting layer and the second patterned superconducting layer. Further, the buried layer can comprise a circuit. The superconductor structure can also comprise a via formed in the second crystalline silicon layer and a transmon qubit comprising a Josephson junction and one or more capacitor pads comprising superconducting material. The Josephson junction can comprise a first superconductor contact, a tunnel barrier layer, and a second superconductor contact.

In an implementation, the superconductor structure can comprise a surface superconducting layer over at least a portion of the second wafer. The via can be a through silicon via or a partial via. The through silicon via can be between the surface superconducting layer and the buried layer. The partial via can be in the second crystalline silicon layer and can comprise a capacitive connection with the second patterned superconducting layer.

According to some implementations, the one or more capacitor pads can be filled vias within the second crystalline silicon layer. In some implementations, the superconducting material can be a first superconducting material and the superconductor structure can comprise a second superconducting material over the second crystalline silicon layer. Further, the one or more circuits can be formed in the second superconducting material.

According to still another embodiment, a superconductor structure can comprise a first wafer comprising a first crystalline silicon layer attached to a first patterned superconducting layer. The superconductor structure can also comprise a second wafer comprising a second crystalline silicon layer attached to a second patterned superconducting layer. The second patterned superconducting layer of the second wafer can be attached to the first patterned superconducting layer of the first wafer. A buried layer can comprise the first patterned superconducting layer and the second patterned superconducting layer. The buried layer can comprise a circuit. The superconductor structure can also comprise one or more capacitor pads comprising superconducting material and a transmon qubit comprising a vertical Josephson junction. The vertical Josephson junction can comprise a first superconductor contact, a tunnel barrier layer, and a second superconductor contact.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Provided herein is a quantum information device that can comprise one or more superconducting quantum circuits. The one or more superconducting quantum circuits can comprise one or more qubits. In an example, a qubit can be a transmon qubit, a qubit that uses more than one Josephson junction, or another type of qubit. The quantum information device can comprise circuitry located in a buried layer. According to some implementations, the quantum information device can comprise circuitry located in the buried layer and on a top layer (e.g., two layers of circuits). The two layers of circuits can be utilized to couple different qubits, provide inputs (e.g., writing to the qubit), and outputs (e.g., reading from the qubit).

Figure 1:
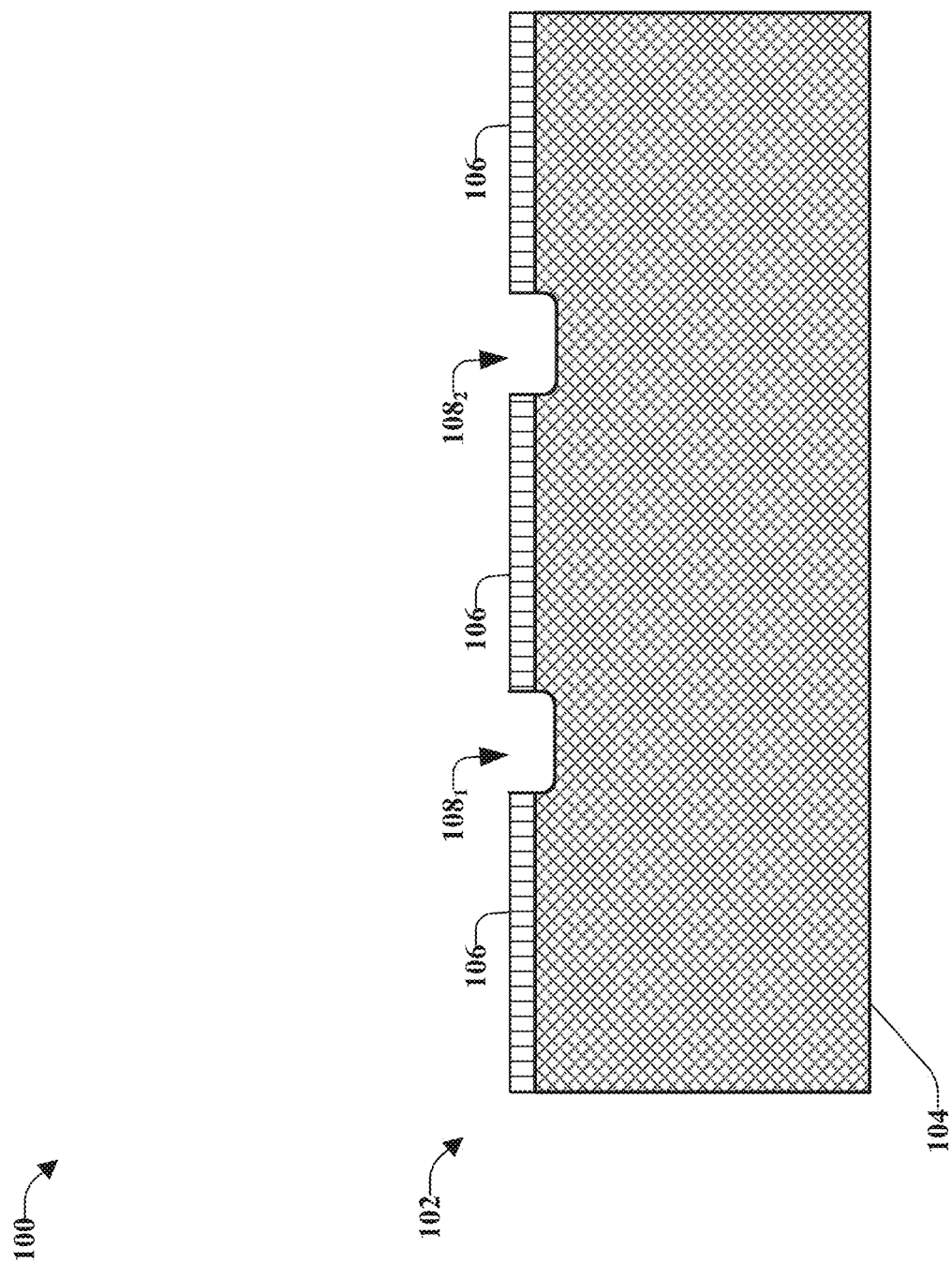
FIG. 1 illustrates an example, non-limiting, side cross-sectional view of a structure for an embodiment of a quantum information device during a fabrication process wherein a first wafer is formed in accordance with one or more embodiments described herein.

FIG. 1 illustrates an example, non-limiting, side cross-sectional view of a structure for an embodiment of a quantum information device 100 during a fabrication process wherein a first wafer 102 is formed in accordance with one or more embodiments described herein.

The first wafer 102 can comprise a first layer of silicon. According to an implementation, the first layer of silicon can be a first crystalline silicon layer 104. The first wafer 102 can also comprise a superconductor (e.g., a superconducting layer) that can be attached to the first crystalline silicon layer 104. In an example, the superconductor can be patterned (e.g., a first patterned superconducting layer 106). Patterned portions of the first patterned superconducting layer 106 are represented by etched patterned areas, illustrated as a first patterned area $108_1$ and a second patterned area $108_2$. It is noted that although two patterned areas (e.g., the first patterned area $108_1$ and the second patterned area $108_2$) are illustrated, the disclosed aspects are not limited to this implementation and more than two patterned areas (or a single patterned area) can be utilized with the disclosed aspects. Further, as illustrated, the etched areas can extend, at least partially, into the first crystalline silicon layer 104 due to the etching process.

Figure 2:
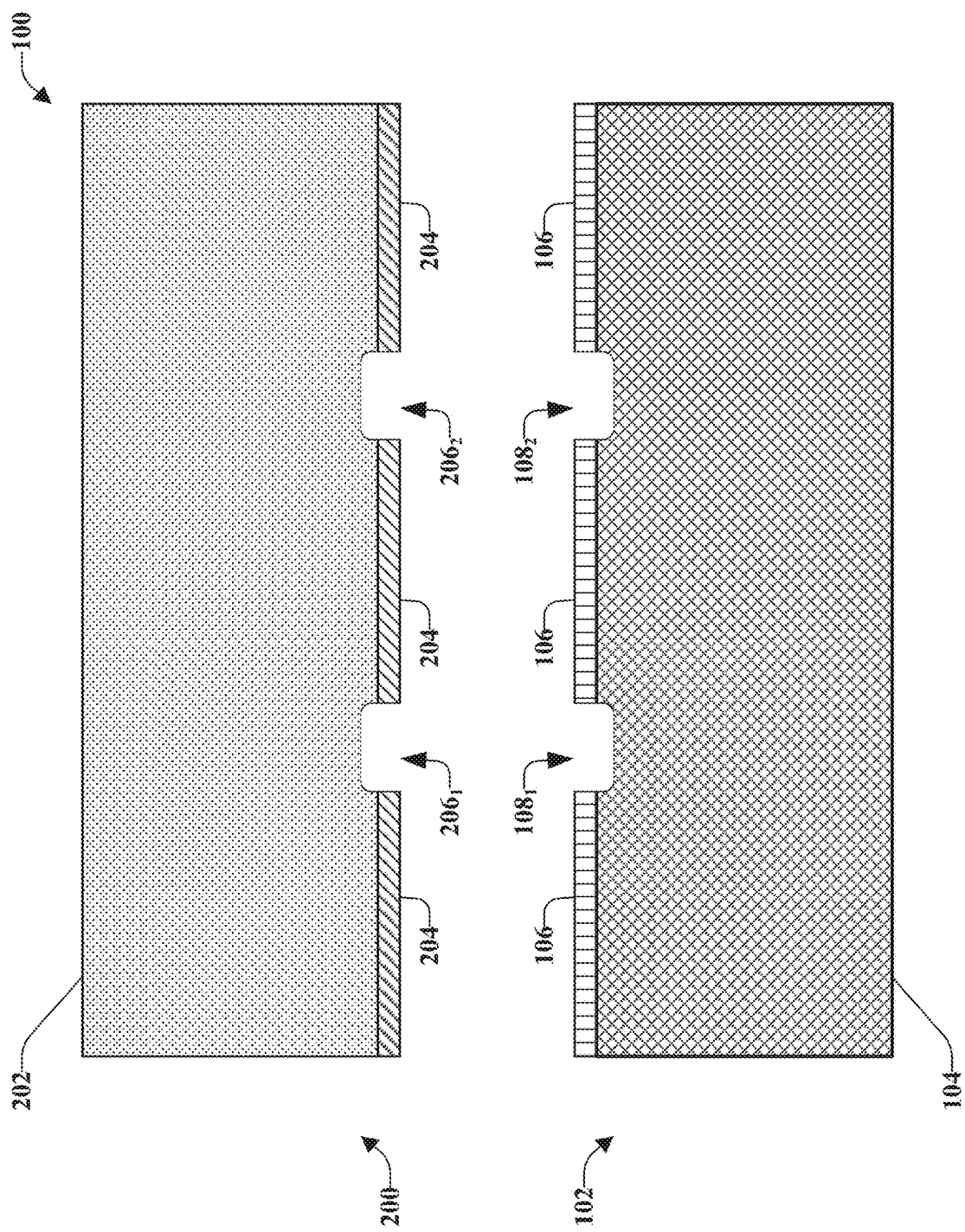
FIG. 2 illustrates an example, non-limiting, side cross-sectional view of the structure of the quantum information device of FIG. 1 during a fabrication process wherein a second wafer is formed in accordance with one or more embodiments described herein.

FIG. 2 illustrates an example, non-limiting, side cross-sectional view of the structure of the quantum information device 100 of FIG. 1 during a fabrication process wherein a second wafer 200 is formed in accordance with one or more embodiments described herein. Repetitive description of like elements employed in other embodiments described herein is omitted for sake of brevity.

Similar to the first wafer 102, the second wafer 200 can comprise a second layer of silicon. According to an implementation, the second layer of silicon can be a second crystalline silicon layer 202. The second wafer 200 can also comprise a superconducting layer that can be patterned (e.g., a second patterned superconducting layer 204). The second crystalline silicon layer 202 can be attached to the second patterned superconducting layer 204. Patterned portions of the second patterned superconducting layer 204 are represented by etched patterned portions, illustrated as a first patterned area $206_1$ and a second patterned area $206_2$. It is noted that although two patterned areas (e.g., the first patterned area $206_1$ and the second patterned area $206_2$) are illustrated, the disclosed aspects are not limited to this implementation and more than two patterned areas (or a single patterned area) can be utilized with the disclosed aspects.

Figure 3:
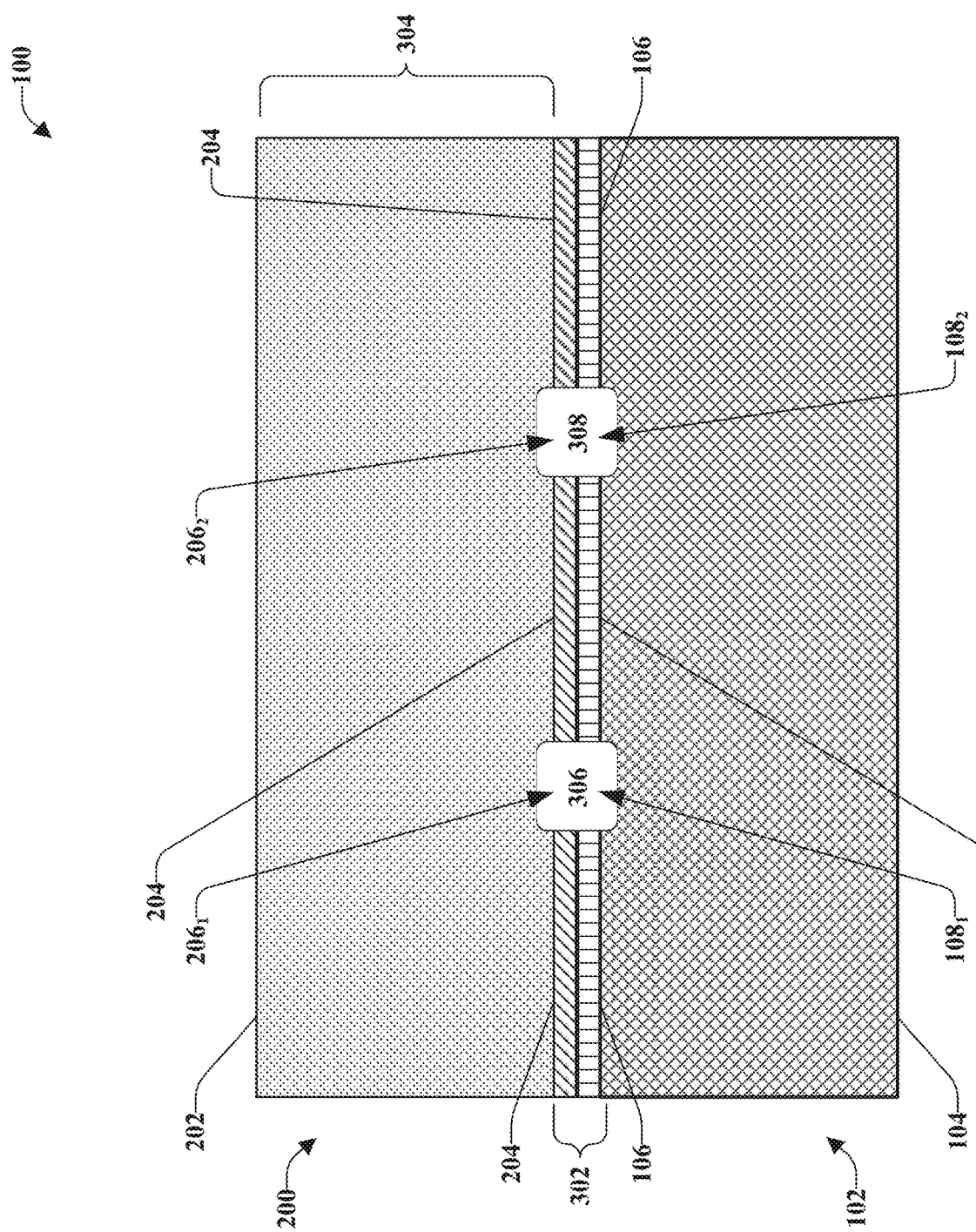
FIG. 3 illustrates an example, non-limiting, side cross-sectional view of the structure of the quantum information device of FIG. 2 during a fabrication process wherein the first wafer is attached to the second wafer in accordance with one or more embodiments described herein.

FIG. 3 illustrates an example, non-limiting, side cross-sectional view of a structure for the quantum information device 100 of FIG. 2 during a fabrication process wherein the first wafer 102 is attached to the second wafer 200 in accordance with one or more embodiments described herein. Repetitive description of like elements employed in other embodiments described herein is omitted for sake of brevity.

As illustrated the etched patterned areas of the first wafer 102 (e.g., the first patterned area $108_1$ and the second patterned area $108_2$) and the etched patterned areas of the second wafer 200 (e.g., the first patterned area $206_1$ and the second patterned area $206_2$) can be mirrored patterns. For example, as illustrated, the first patterned area $206_1$ of the second wafer 200 can mirror the first patterned area $108_1$ of the first wafer 102 (as a first buried circuit pattern 306) and the second patterned area $206_2$ of the second wafer 200 can mirror the second patterned area $108_2$ of the first wafer 102 (as a second buried circuit pattern 308). Although two buried circuit patterns are illustrated and described, various aspects can utilize a different number of buried circuit patterns.

The disclosed aspects are not limited to mirrored patterns. Instead, less than all of the patterned areas of the first wafer 102 (e.g., the first patterned area $108_1$ and the second patterned area $108_2$) and the patterned areas of the second wafer 200 (e.g., the first patterned area $206_1$ and the second patterned area $206_2$) can be mirrored. Thus, a first set of the patterned areas of the first wafer 102 and the second wafer 200 can be different, while a second set of the patterned areas of the first wafer 102 and the second wafer 200 can be mirrored. In some implementations, the patterned areas of the first wafer 102 and the second wafer 200 can be different patterns (e.g., none of the patterned areas of the second wafer 200 mirror the patterned areas of the first wafer 102).

To attach the first wafer 102 and the second wafer 200, pressure and elevated temperature can be applied. Upon or after the bonding of the wafers (e.g., the first wafer 102 and the second wafer 200), one or more circuits can be defined by the etched portions (e.g., the first patterned area $108_1$, the second patterned area $108_2$, the first patterned area $206_1$, the second patterned area $206_2$). The area of the quantum information device 100 created by the first patterned superconducting layer 106 and the second patterned superconducting layer 204, which includes the one or more circuits, represents a buried layer 302.

Conventional techniques for SOM manufacturing do not comprise wafers that are prepatterned, as discussed herein. Instead, to create a circuit in a buried layer using conventional techniques, etching through the entire structure is performed. However, once the entire structure is etched through, some of the properties of the crystalline silicon substrate can be lost. The disclosed aspects mitigate or eliminate the need to etch through the entire structure through the pre-patterning of the wafers to form the one or more circuits in the buried layer. Thus, the properties of the crystalline silicon substrate can be retained, which helps preserve long coherence times.

Figure 4:
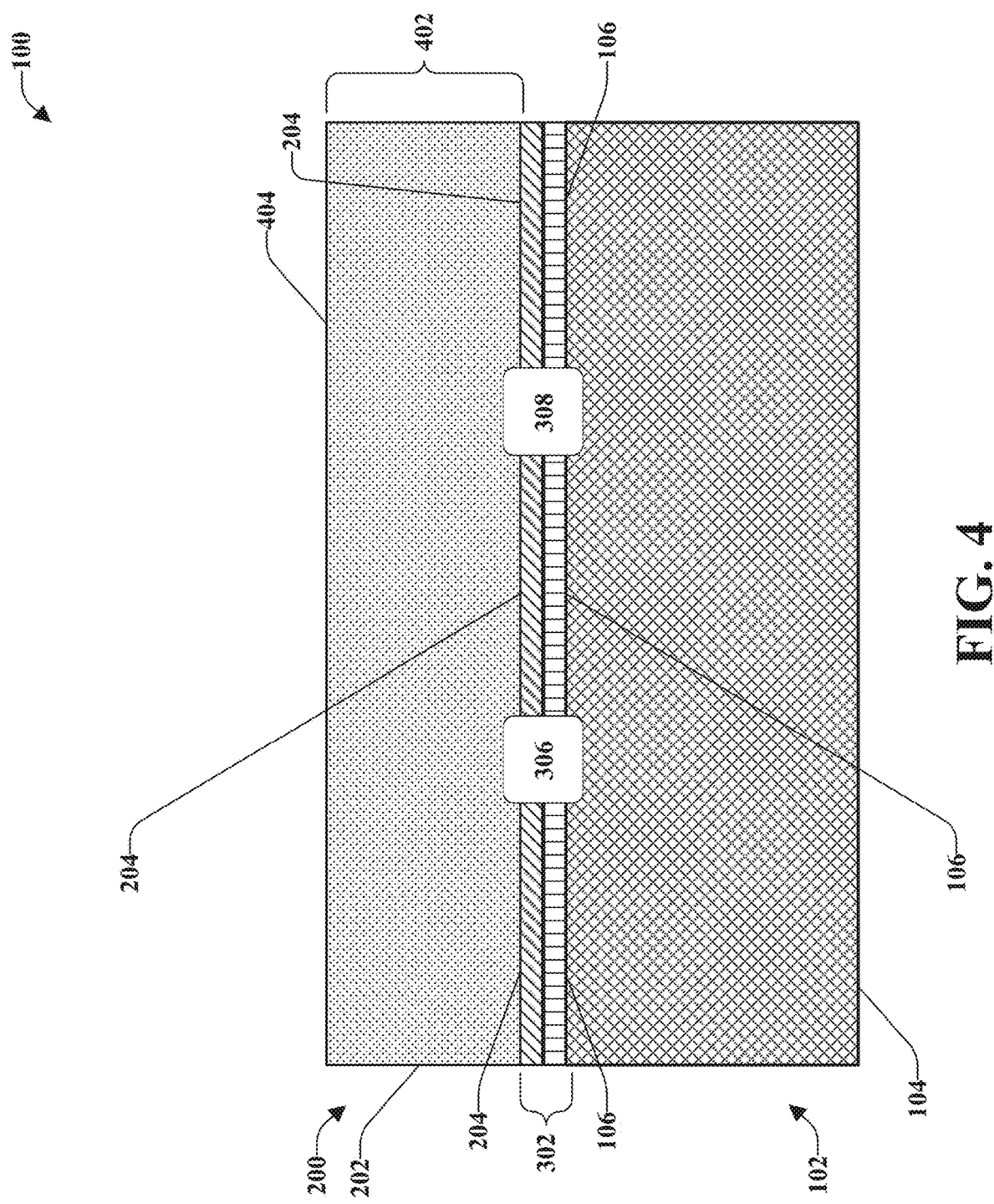
FIG. 4 illustrates an example, non-limiting, side cross-sectional view of the structure of the quantum information device of FIG. 3 during a fabrication process wherein a thickness of the second wafer is reduced in accordance with one or more embodiments described herein.

FIG. 4 illustrates an example, non-limiting, side cross-sectional view of the structure of the quantum information device 100 of FIG. 3 during a fabrication process wherein a thickness of the second wafer 200 is reduced in accordance with one or more embodiments described herein. Repetitive description of like elements employed in other embodiments described herein is omitted for sake of brevity.

The second crystalline silicon layer 202 can be thinned to a defined height. Therefore, upon or after the thinning of the second crystalline silicon layer 202, the first crystalline silicon layer 104 and the second crystalline silicon layer 202 can comprise different heights.

To visualize the thinning of the second crystalline silicon layer 202, refer to FIG. 3 where the second crystalline silicon layer 202 comprises a first height 304. As illustrated in FIG. 4, the second crystalline silicon layer 202 can be thinned or reduced in height to a second height 402. To reduce or thin the height of the second crystalline silicon layer 202, a top surface 404 of the second crystalline silicon layer 202 can be grinded down and polished. The top surface 404 of the second crystalline silicon layer 202 can be the portion of the second wafer 200 that is opposite the second patterned superconducting layer 204.

According to an implementation, the second crystalline silicon layer 202 can be thinned to an example, non-limiting, thickness range (e.g., the second height 402) of between around 100 nm-100 um. However, other thickness ranges can be utilized with the disclosed aspects.

A thicker second crystalline silicon layer can be in the range of between around 1 um to around 100 um, for example. The thicker second crystalline silicon layer can be intended for applications that utilize less coupling (e.g., weakly coupled) between one or more circuits in a buried layer (e.g., the buried layer 302) and one or more circuits in a top layer (e.g., a layer located on or over the top surface 404 of the second crystalline silicon layer 202 as will be discussed with respect to FIG. 5 below) of the quantum information device 100. Accordingly, a thicker second crystalline silicon layer can be utilized for implementations of various quantum circuits.

A thinner second crystalline silicon layer can comprise a thickness range between around 100 nm to around 1 um, for example. The thinner second crystalline silicon layer can be intended for applications that utilize more coupling between one or more circuits in a buried layer (e.g., the buried layer 302) and one or more circuits in a top layer.

According to some implementations, a thinner second crystalline silicon layer can be utilized for implementations that utilize a vertical transmon (e.g., a via with a Josephson junction inside the via). A transmon is a specific type of qubit. Accordingly, a thin second crystalline silicon layer can be utilized for implementations of various other quantum circuits. It is noted that although discussed with respect to the thinner second crystalline silicon layer, one or more Josephson junctions can be utilized in the thicker second crystalline silicon layer. However, the functionalities can be different and the circuit designs can be adapted for the intended application.

Figure 5:
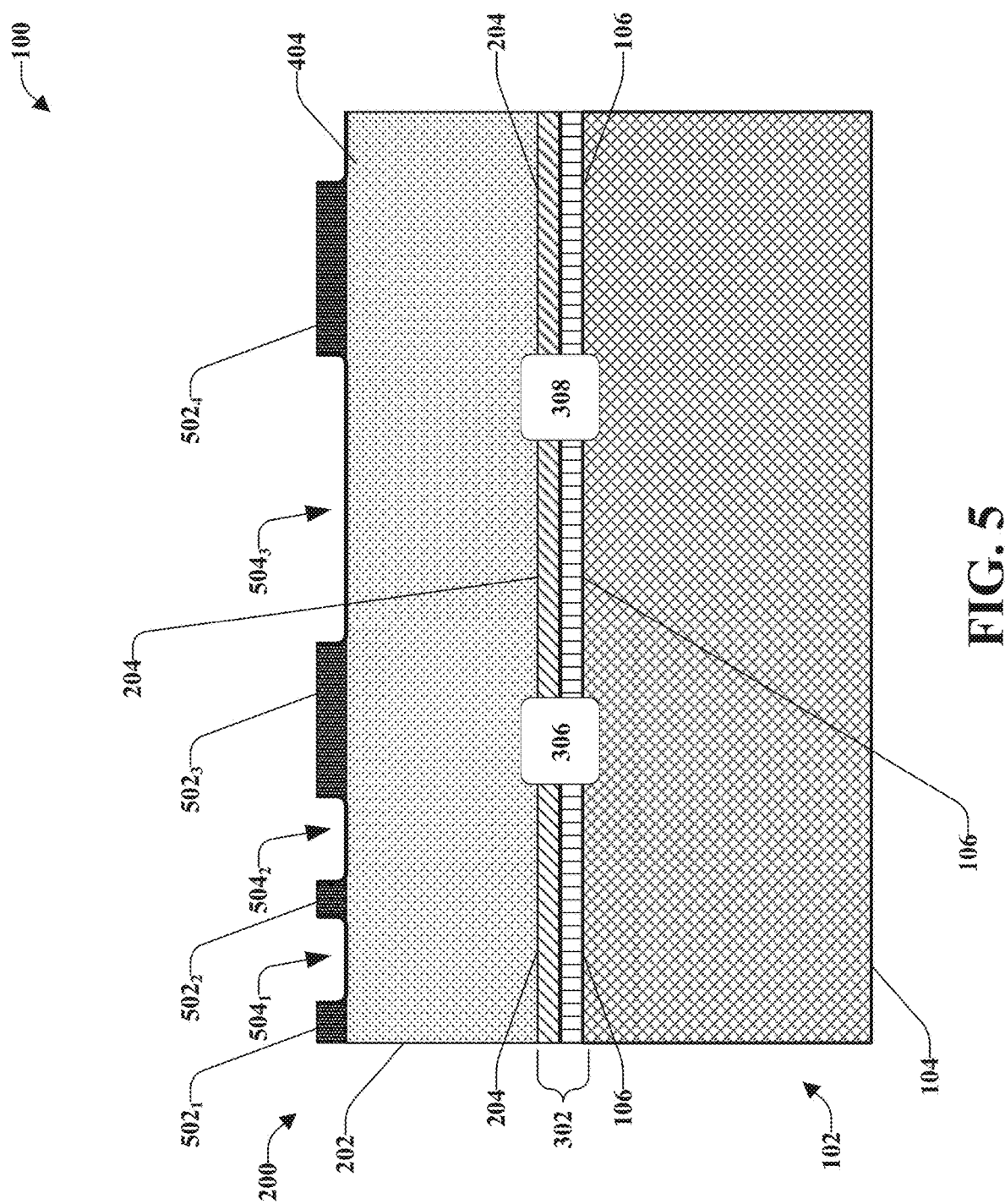
FIG. 5 illustrates an example, non-limiting, side cross-sectional view of the structure of the quantum information device of FIG. 4 during a fabrication process wherein superconducting metal can be evaporated on a top surface of the second wafer in accordance with one or more embodiments described herein.

FIG. 5 illustrates an example, non-limiting, side cross-sectional view of the structure of the quantum information device 100 of FIG. 4 during a fabrication process wherein superconducting metal can be evaporated on a top surface 404 of the second wafer 200 in accordance with one or more embodiments described herein. Repetitive description of like elements employed in other embodiments described herein is omitted for sake of brevity.

Upon or after the thinning down of the second crystalline silicon layer 202, a superconducting metal can be deposited (e.g., sputtering, evaporation, Atomic Layer Deposition, electroplating, or another deposition technique) on the top surface 404 of the second wafer 200. For example, the top surface 404 can be masked to control deposition or subsequent etching of the superconducting metal. As indicated, one or more areas of superconducting metal can be deposited or subsequently removed (for example, by etching) and there can be respective areas therebetween where the top surface 404 is exposed.

In the example illustrated in FIG. 5, there is a first section of superconducting metal $502_1$, a second section of superconducting metal $502_2$, a third section of superconducting metal $502_3$, and a fourth section of superconducting metal $502_4$. Further to this example, a first etched area $504_1$ is between the first section of superconducting metal $502_1$ and the second section of superconducting metal $502_2$; a second etched area $504_2$ is between the second section of superconducting metal $502_2$ and the third section of superconducting metal $502_3$, and a third etched area $504_3$ is between the third section of superconducting metal $502_3$ and the fourth section of superconducting metal $502_4$. It is noted that although illustrated and described with respect to four sections of superconducting material (e.g., the first section of superconducting metal $502_1$, the second section of superconducting metal $502_2$, the third section of superconducting metal $502_3$, and the fourth section of superconducting metal $502_4$) and three areas exposing the top surface of the second crystalline silicon layer (e.g., the first etched area $504_1$, the second etched area $504_2$, the third etched area $504_3$), the disclosed aspects are not limited to this implementation and other numbers of superconducting material and etched area can be included according to various aspects.

It is noted that the second crystalline silicon layer 202 illustrated in FIG. 5 represents a thicker second crystalline silicon layer. According to an embodiment where the second crystalline silicon layer 202 is thick, the layers (e.g., the buried layer 302 and the layer comprising superconducting metal 502 and etched areas 504) can be designed such that the layers can be independent from one another. In this embodiment, the top layer (e.g., the layer comprising the superconducting metal 502 and the etched areas 504) can comprise the superconducting material (e.g., the first section of superconducting metal $502_1$, the second section of superconducting metal $502_2$, the third section of superconducting metal $502_3$, and the fourth section of superconducting metal $502_4$). In accordance with the embodiments where the second crystalline silicon layer 202 is thin, the layers can interact and should be designed accordingly. For example, the layers can be designed by adjusting the line impedance (e.g., more space between signal and ground). Alternatively, the layers can be designed by etching out the space above the signal lines.

Figure 6:
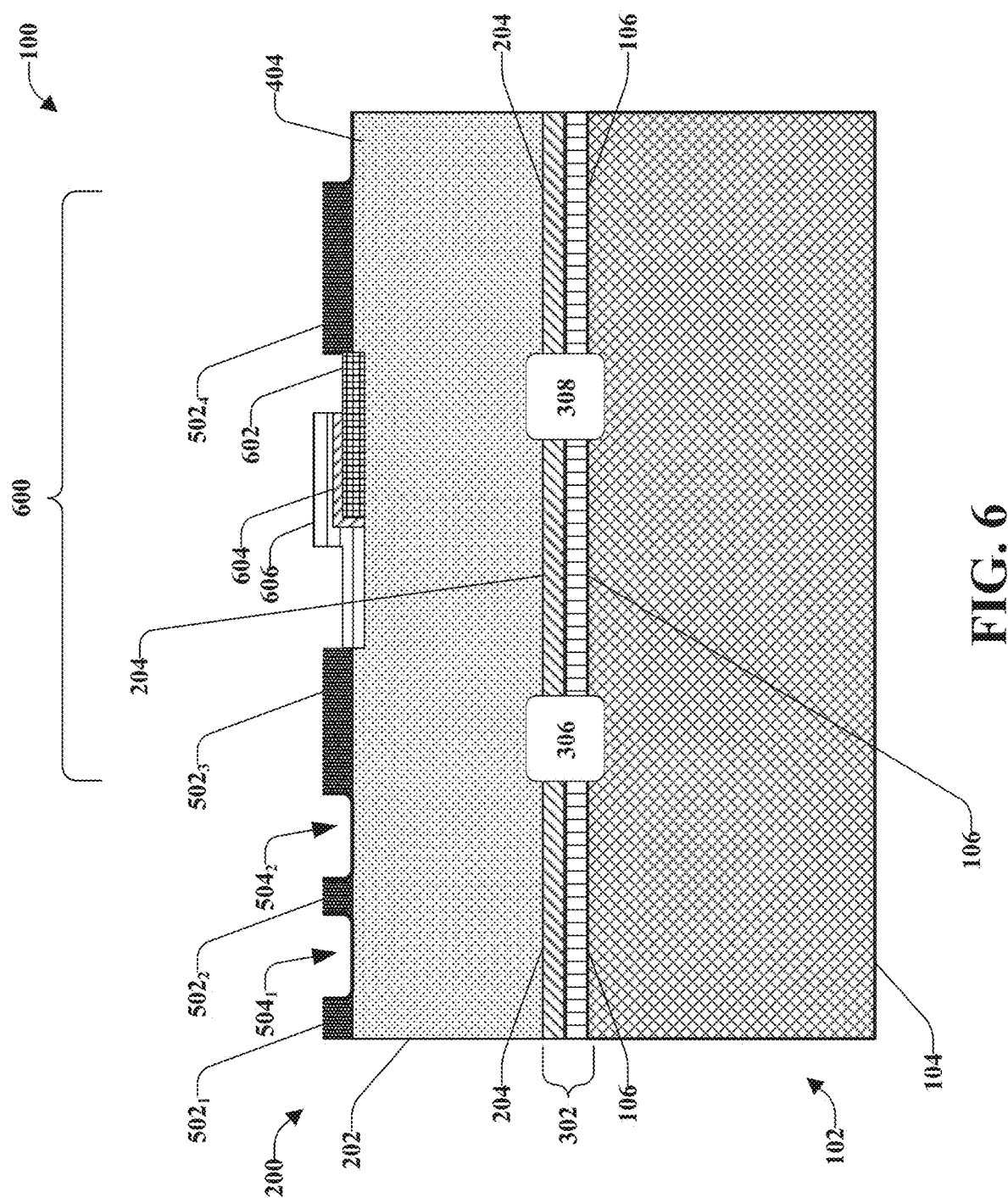
FIG. 6 illustrates an example, non-limiting, side cross-sectional view of the structure of the quantum information device of FIG. 5 during a fabrication process wherein a Josephson junction is fabricated in accordance with one or more embodiments described herein.

FIG. 6 illustrates an example, non-limiting, side cross-sectional view of the structure of the quantum information device 100 of FIG. 5 during a fabrication process wherein a Josephson junction is fabricated in accordance with one or more embodiments described herein. Repetitive description of like elements employed in other embodiments described herein is omitted for sake of brevity.

One or more qubits can be formed on the top surface 404. For example, a planar qubit, which comprises a planar Josephson junction, can be a transmon qubit 600, can be formed on the top surface 404. Although a single qubit is illustrated, more than one qubit can be utilized. Forming the one or more qubits on the top surface can enable full control of a waveguide design at a bottom superconducting layer (e.g., the buried layer 302).

The transmon qubit 600 can comprise a Josephson junction that can comprise a first superconductor contact 602, a tunnel barrier layer 604, and a second superconductor contact 606. The transmon qubit 600 can also comprise the third section of superconducting metal $502_3$ and the fourth section of superconducting metal $502_4$. The third section of superconducting metal $502_3$ can be a first capacitive pad of the transmon qubit 600 and the fourth section of superconducting metal $502_4$ can be a second capacitive pad of the transmon qubit 600.

For example, as illustrated, a side of the first superconductor contact 602 can contact the fourth section of superconducting metal $502_4$. Further, a side of the second superconductor contact 606 can contact the third section of superconducting metal $502_3$. Thus, the third section of superconducting metal $502_3$ can be the first capacitor pad and the fourth section of superconducting metal $502_4$ can be the second capacitor pad. In an example, the Josephson junction can be fabricated by shadow and angle evaporation.

Figure 7:
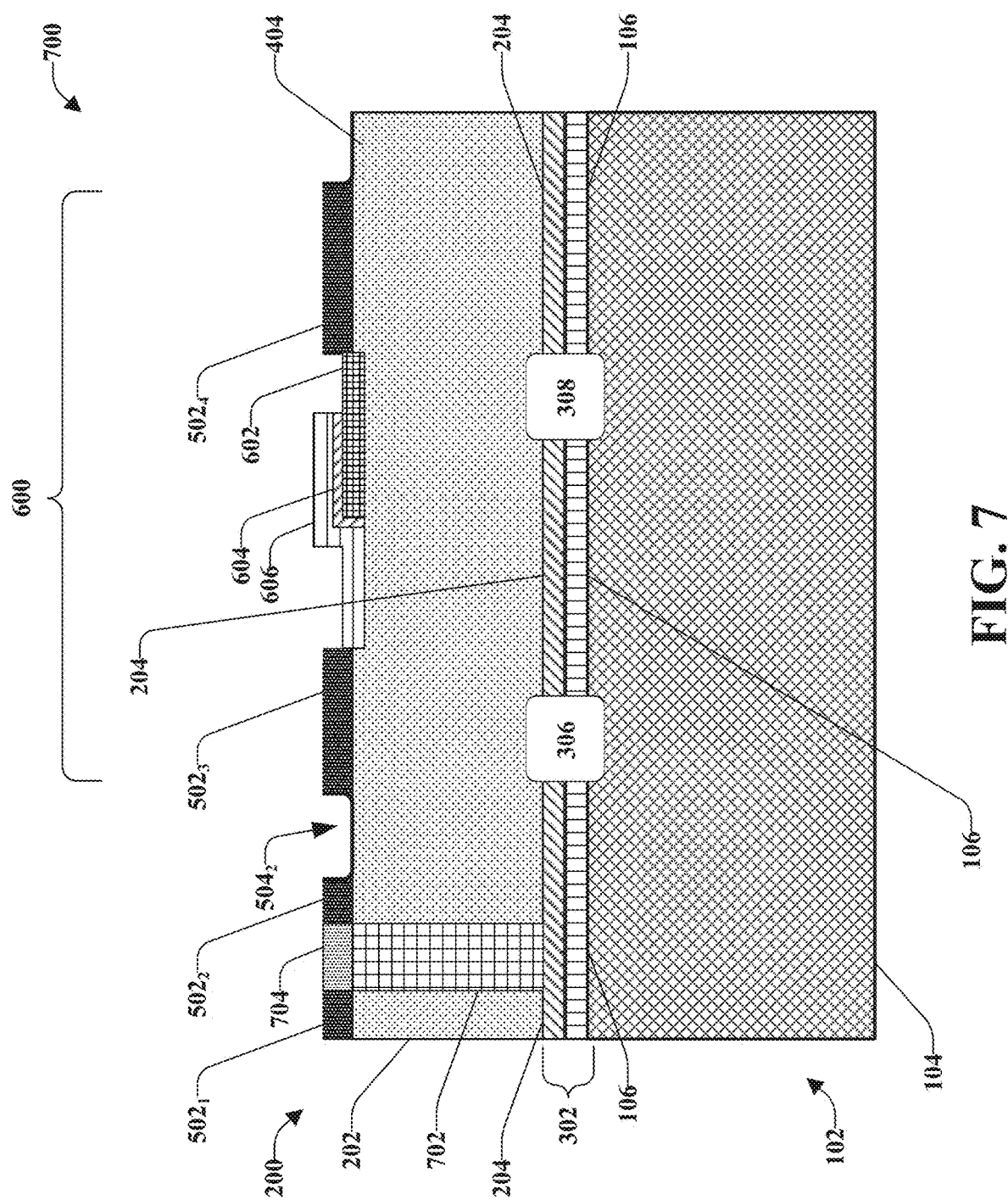
FIG. 7 illustrates an example, non-limiting, side cross-sectional view of a structure for another embodiment of a quantum information device wherein a via is utilized for connections between top and bottom substrates in accordance with one or more embodiments described herein.

FIG. 7 illustrates an example, non-limiting, side cross-sectional view of a structure for another embodiment of a quantum information device 700 wherein a via is utilized for connections between top and bottom substrates in accordance with one or more embodiments described herein. Repetitive description of like elements employed in other embodiments described herein is omitted for sake of brevity.

The quantum information device 700 of FIG. 7 comprises an optional via 702 that can be manufactured between the two layers (e.g., the buried layer 302 and the layer comprising the superconducting metal 502 and the etched areas 504). To manufacture the via 702, a deep etch can be created in the silicon (e.g., the second crystalline silicon layer 202)

and the etch can be filled with a superconducting metal. Further, a connecting layer 704 at the top surface can be created, since that surface was removed when the etch was formed in the silicon (e.g., the second crystalline silicon layer 202). The connecting layer 704 can be created with a superconducting metal, which can be the same superconducting metal utilized to create the via 702, or a different superconducting metal.

The via 702 can connect the top substrate (e.g., the layer comprising the superconducting metal 502 and the etched areas 504) and the bottom substrate (e.g., the buried layer 302). Accordingly, the via can provide a connecting circuit from the buried layer 302 to the top metal circuit (e.g., the superconducting metal 502 and the etched areas 504).

Further, although only one via is illustrated, the quantum information device can comprise more than one via. In an example, the one or more vias can be employed in box mode suppression in the silicon layer.

When a thicker second crystalline silicon layer (as discussed with respect to FIG. 4) is utilized, which comprises less coupling, the vias can be through-silicon vias (TSVs). Alternatively, when a thinner second crystalline silicon layer (as discussed with respect to FIG. 4) is utilized, which comprises more coupling, the vias can be manufactured utilizing an etch and fill technique.

Figure 8:
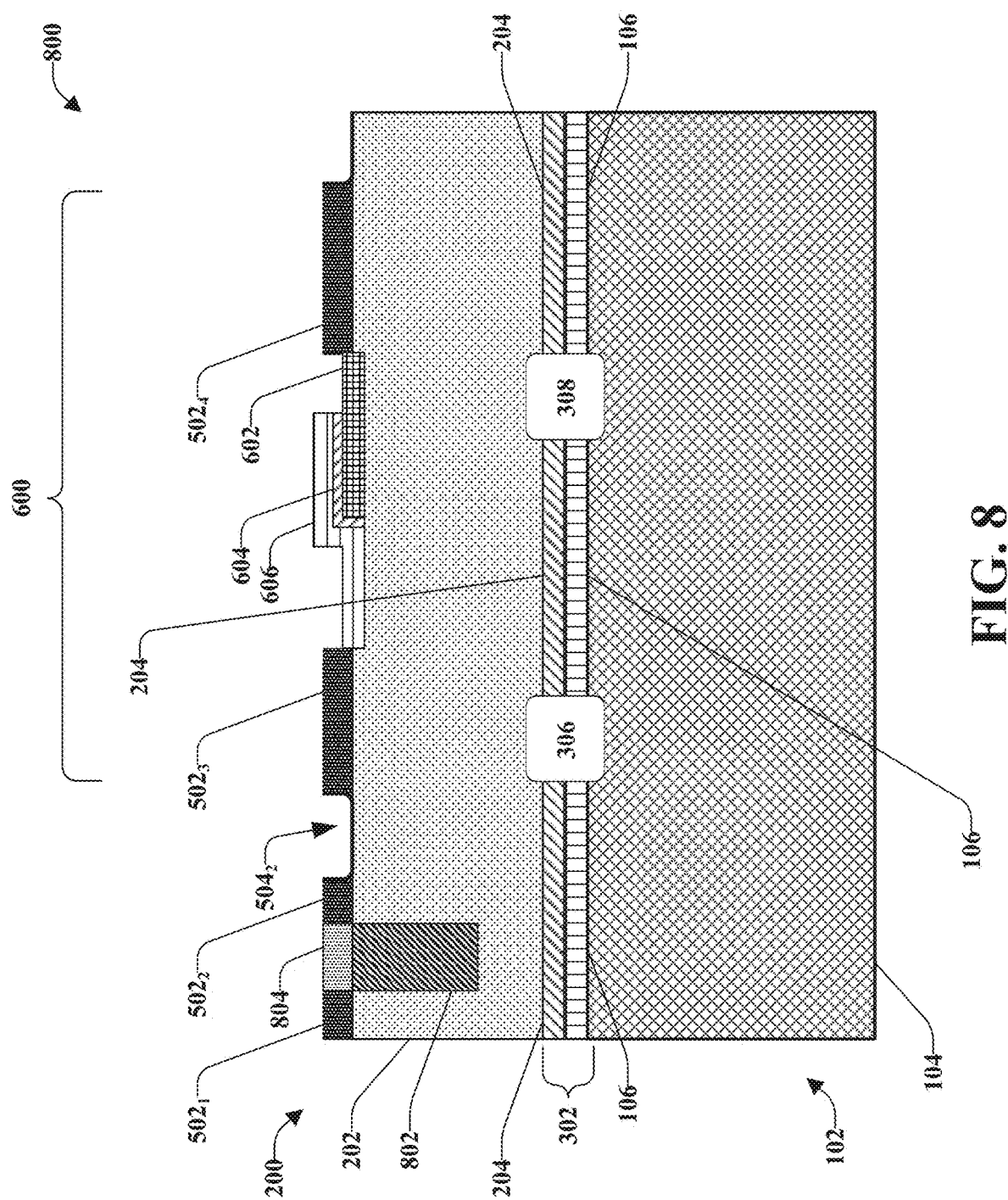
FIG. 8 illustrates an example, non-limiting, side cross-sectional view of a structure for another embodiment of a quantum information device wherein a partial via is manufactured in accordance with one or more embodiments described herein.

FIG. 8 illustrates an example, non-limiting, side cross-sectional view of a structure for another embodiment of a quantum information device 800 wherein a partial via is manufactured in accordance with one or more embodiments described herein. Repetitive description of like elements employed in other embodiments described herein is omitted for sake of brevity.

As illustrated, a via 802 can capacitively couple a top substrate (e.g., the layer comprising the superconducting metal 502 and the etched areas 504) and a bottom substrate (e.g., the buried layer 302) at a defined location. In some implementations more than one partial via can be utilized at defined locations to capacitively couple the top and bottom substrates.

According to the embodiment of FIG. 8, instead of etching the via 802 all the way through to the buried layer 302 and filling the etched region with superconducting material (as discussed with respect to FIG. 7), the via is deep but stops short of connecting all the way to the buried layer (e.g., the buried layer 302). Accordingly, the via 802 can capacitively couple the circuit(s) on the top layer (e.g., the layer comprising the superconducting metal 502 and the etched areas 504) to the circuit(s) in the buried layer 302.

Further, a connecting layer 804 can be created at the top surface to replace the portions of the top surface that were removed when the etch was formed in the silicon (e.g., the second crystalline silicon layer 202). The connecting layer 804 can be created with a superconducting metal, which can be the same superconducting metal utilized to create the via 802, or a different superconducting metal.

Figure 9:
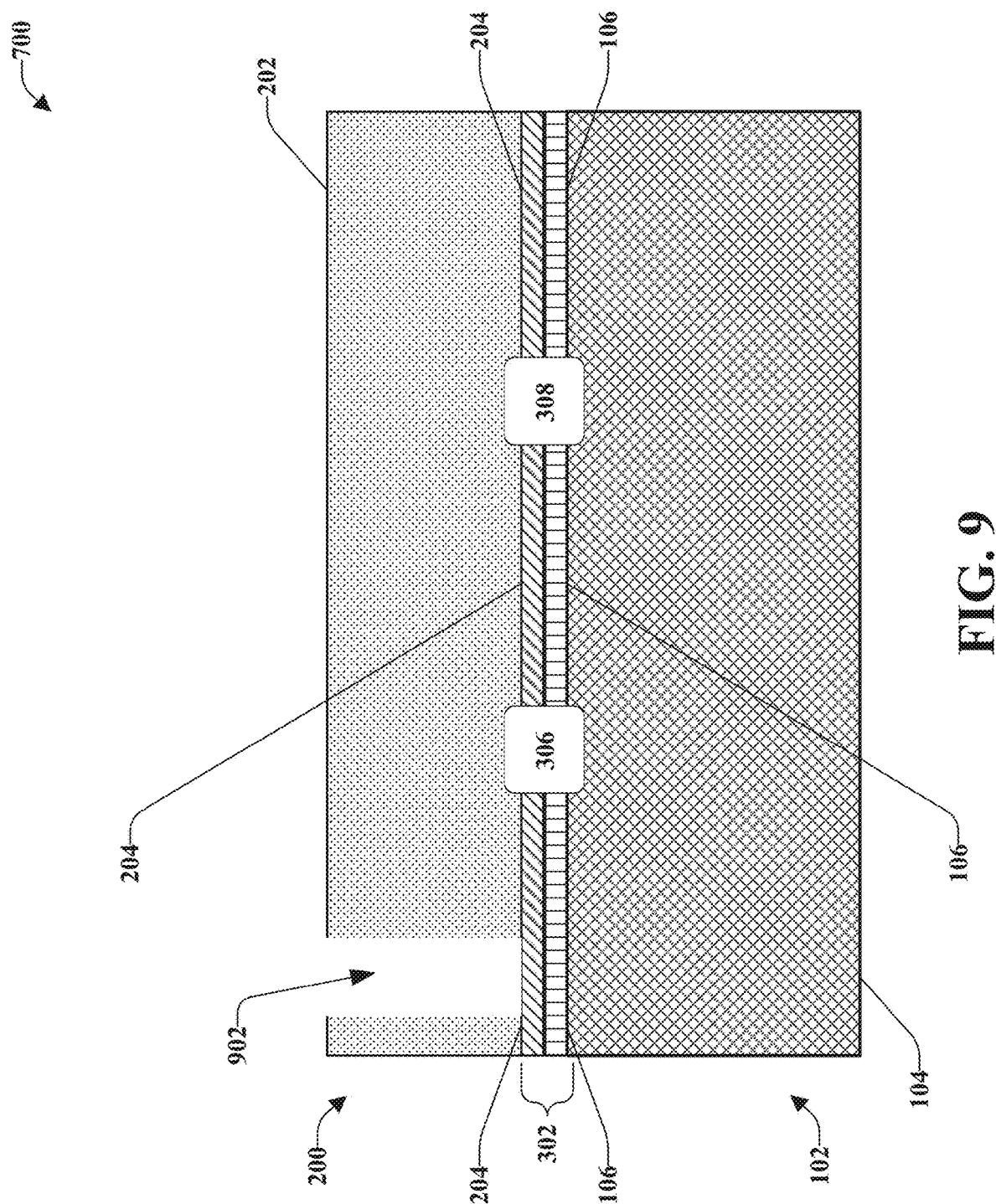
FIG. 9 illustrates an example, non-limiting, side cross-sectional view of the structure of the quantum information device of FIG. 7 and/or the quantum information device of FIG. 8 during a fabrication process wherein a via is etched in accordance with one or more embodiments described herein.

FIG. 9 illustrates an example, non-limiting, side cross-sectional view of the structure of the quantum information device 700 of FIG. 7 and/or the quantum information device 800 of FIG. 8 during a fabrication process wherein a via is etched in accordance with one or more embodiments described herein. Repetitive description of like elements employed in other embodiments described herein is omitted for sake of brevity. It is noted that although FIG. 9 is illustrated and described with reference to the quantum information device 700 of FIG. 7, a similar manufacturing process can be utilized for the quantum information device 800 of FIG. 8.

The process illustrated in FIG. 9 begins upon or after thinning down the second crystalline silicon layer 202 (as discussed with respect to FIG. 4). In an example, the second crystalline silicon layer 202 (e.g., the top insulator) can be thinned to around 100 nm to 100 um, for example. However, the disclosed aspects are not limited to this height for the second crystalline silicon layer 202.

To form a via 902 (e.g., the via 702, the via 802), the device can be masked and reactive ion etch can be performed. For a thicker second crystalline silicon layer, the via can be a TSV, as illustrated, or a partial via. Alternatively, for a thinner second crystalline silicon layer, the via can be a partial via.

Figure 10:
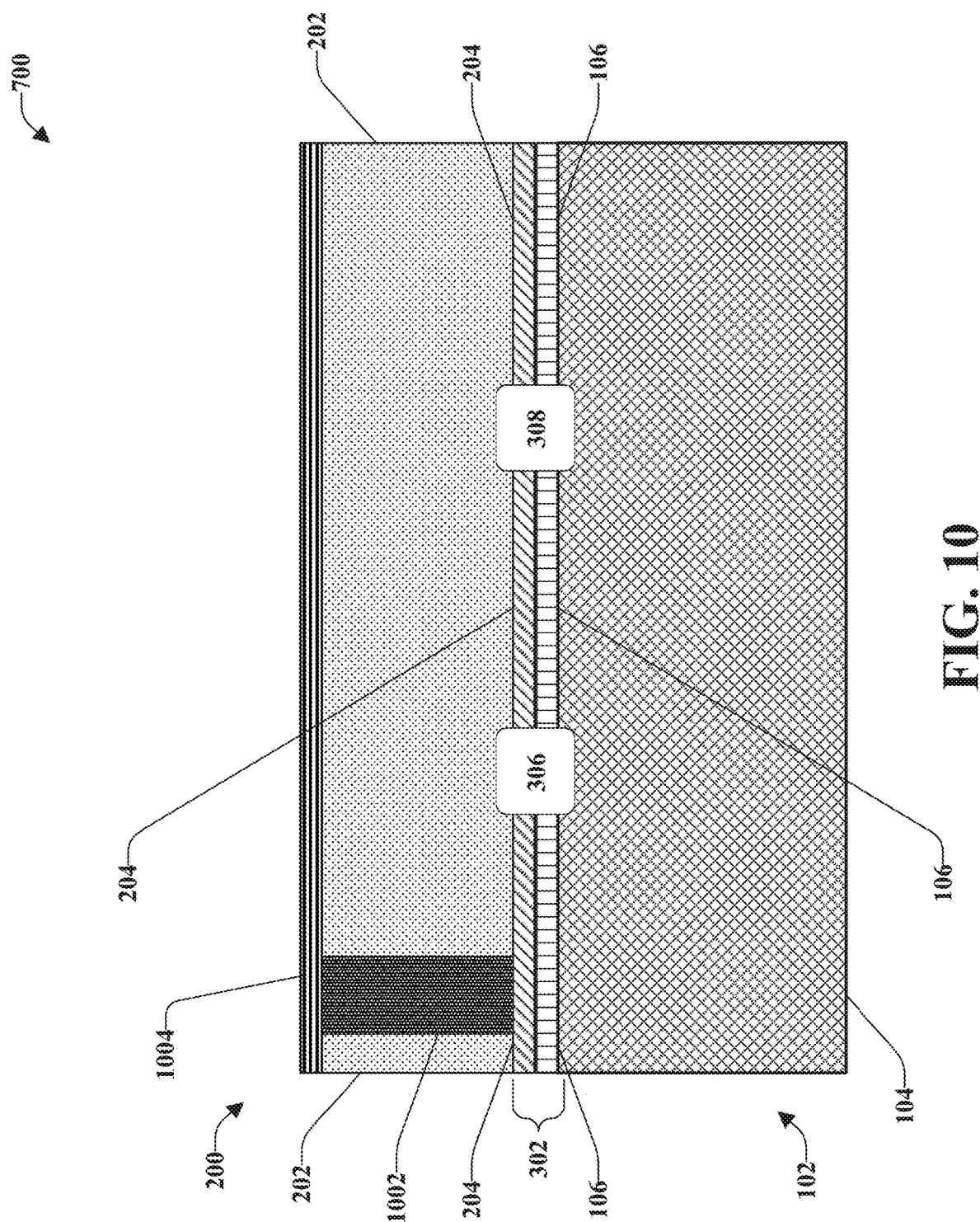
FIG. 10 illustrates an example, non-limiting, side cross-sectional view of the structure of the quantum information device of FIG. 9 during a fabrication process wherein the via is filled in accordance with one or more embodiments described herein.

FIG. 10 illustrates an example, non-limiting, side cross-sectional view of the structure of the quantum information device 700 of FIG. 9 during a fabrication process wherein the via is filled in accordance with one or more embodiments described herein. Repetitive description of like elements employed in other embodiments described herein is omitted for sake of brevity.

As discussed, the second crystalline silicon layer 202 can be ground down (e.g., thinned and polished) to a defined height. The via 902, which can be either a TSV or a partial via can be filled with a superconducting metal 1002. Further, a top layer 1004 can be created with a superconducting metal, which can be the same or different superconducting metal utilized for the via.

According to some implementations, upon or after filling the etched portion with the superconducting metal and/or creating the top layer 1004, a chemical-mechanical planarization (CMP) can be performed. CMP is a polishing process that can be utilized to smooth surfaces. For example, CMP can utilize a chemical slurry formation and a mechanical polishing process to obtain the smooth surfaces. As illustrated, the CMP can create a level surface across the top layer 1004.

For a thicker wafer, the via can be a TSV and filling can be performed by using a seed layer and electroplating. For superconducting materials, the via does not need to be fully filled as long as there is a continuous film (e.g., more than 100 nm thick) on the walls of the TSV. For the thinner wafer, various deposition methods can be used to fill the via.

Figure 11:
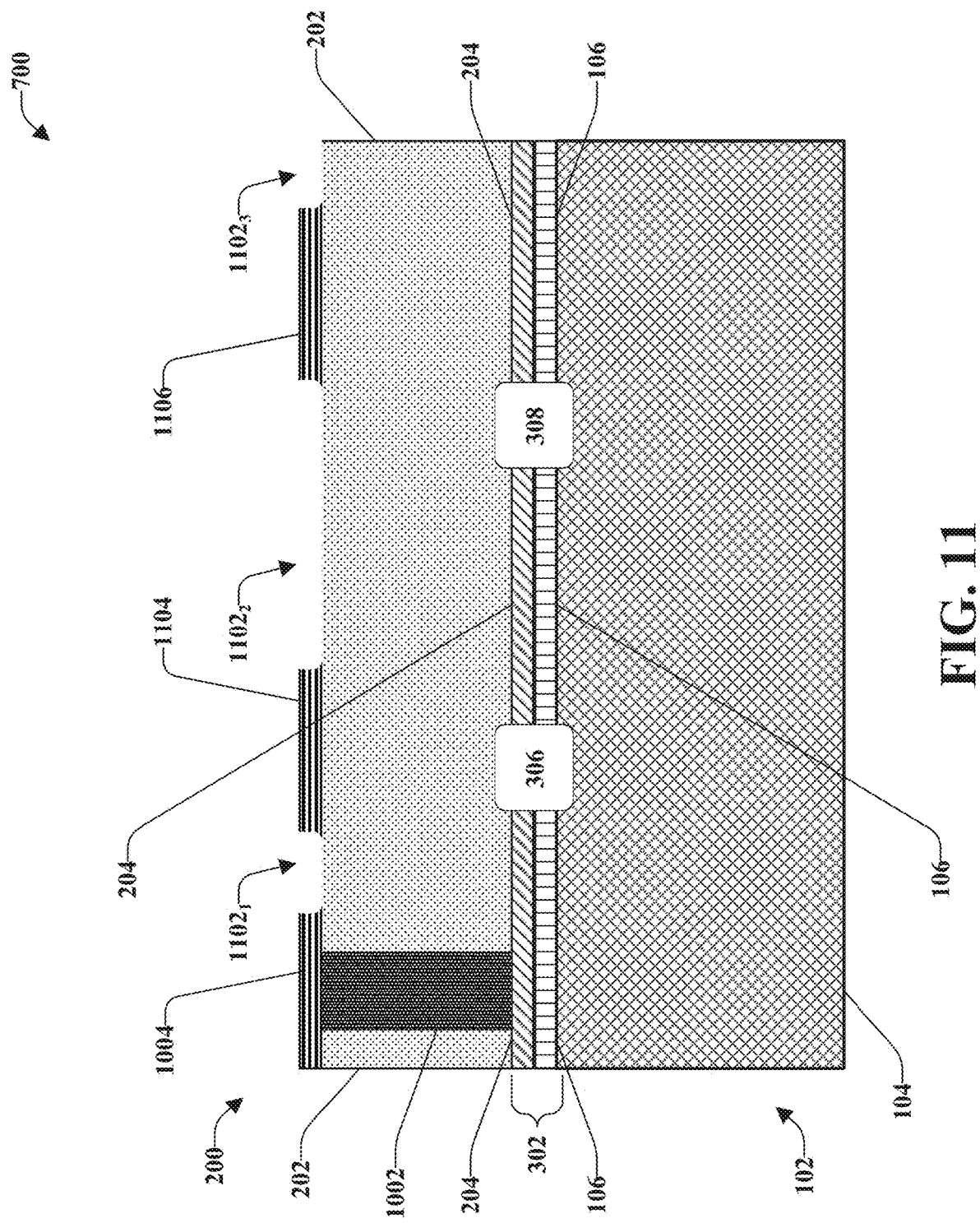
FIG. 11 illustrates an example, non-limiting, side cross-sectional view of the structure of the quantum information device of FIG. 10 during a fabrication process wherein a top surface is masked and etched in accordance with one or more embodiments described herein.

FIG. 11 illustrates an example, non-limiting, side cross-sectional view of the structure of the quantum information device 700 of FIG. 10 during a fabrication process wherein a top surface is masked and etched in accordance with one or more embodiments described herein. Repetitive description of like elements employed in other embodiments described herein is omitted for sake of brevity.

Upon or after forming and filling the via with the superconducting metal 1002, features can be defined. In an example, resonators, as illustrated in FIG. 5, can be created. To define one or more features, portions of the top layer 1004 can be etched, as illustrated at a first etched portion $1102_1$, a second etched portion $1102_2$, and a third etched portion $1102_3$. According to an implementation, the first etched portion $1102_1$ and the second etched portion $1102_2$ can define a first portion of the top layer 1004 that can be utilized as a first capacitor pad 1104 of a transmon qubit and the second etched portion $1102_2$ and the third etched portion $1102_3$ can define a second portion of the top layer 1004 that can be utilized as a second capacitor pad 1106 for the transmon qubit, as will be discussed with reference to FIG. 12 below.

Figure 12:
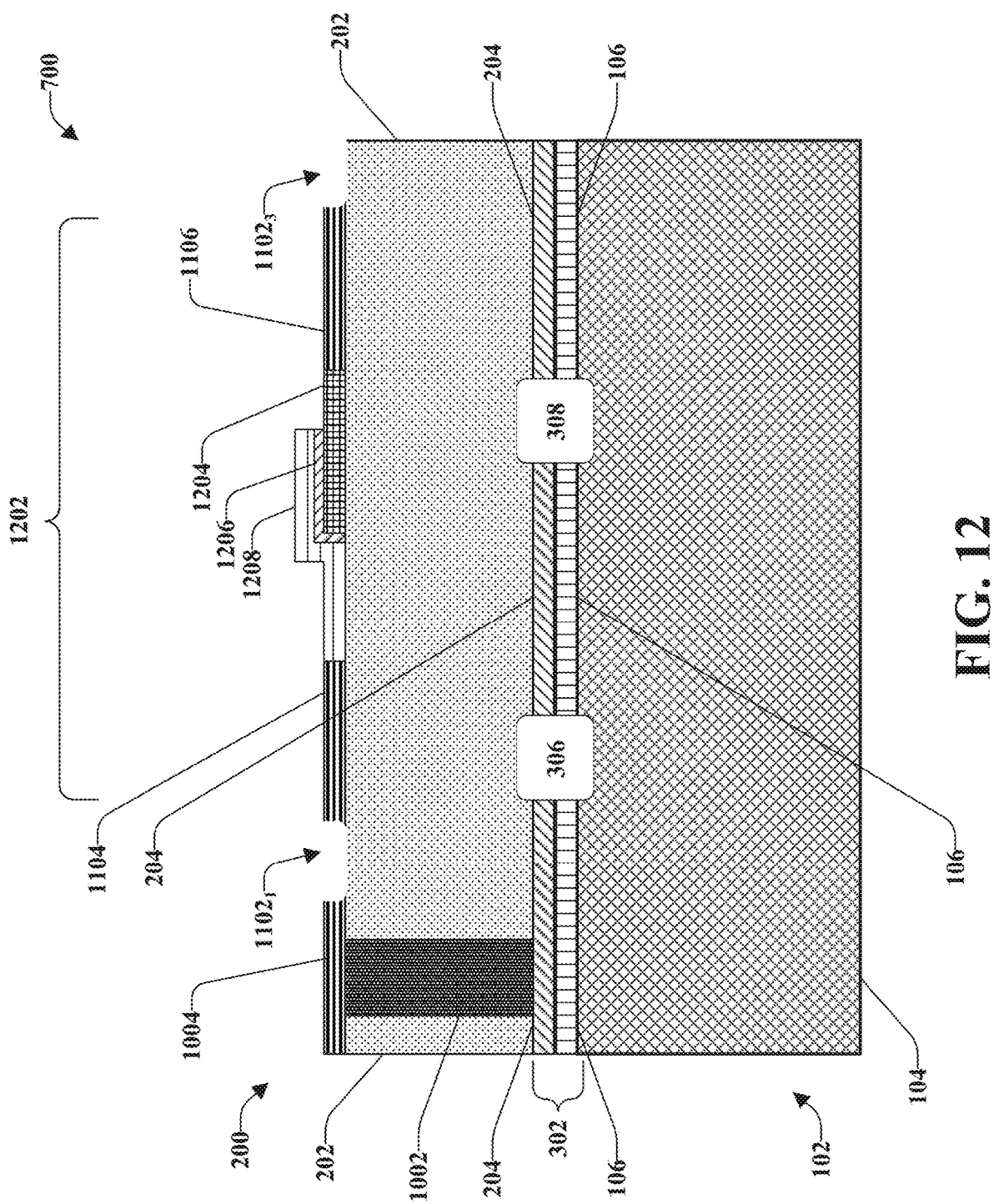
FIG. 12 illustrates an example, non-limiting, side cross-sectional view of the structure of the quantum information device of FIG. 11 during a fabrication process wherein a Josephson junction is fabricated in accordance with one or more embodiments described herein.

FIG. 12 illustrates an example, non-limiting, side cross-sectional view of the structure of the quantum information device 700 of FIG. 11 during a fabrication process wherein a Josephson junction is fabricated in accordance with one or more embodiments described herein. Repetitive description of like elements employed in other embodiments described herein is omitted for sake of brevity.

Similar to the fabrication of the Josephson junction as illustrated and described with respect to the quantum information device 100 of FIG. 6, a Josephson junction can be formed in the quantum information device 700 to create a qubit 1202. The qubit 1202 can comprise the Josephson junction, the first capacitor pad 1104 and the second capacitor pad 1106. The Josephson junction can be formed in the etched layer of the top surface (e.g., the second etched portion 1102$_2$), for example. The Josephson junction can comprise a first superconductor contact 1204, a tunnel barrier layer 1206, and a second superconductor contact 1208.

Figure 13:
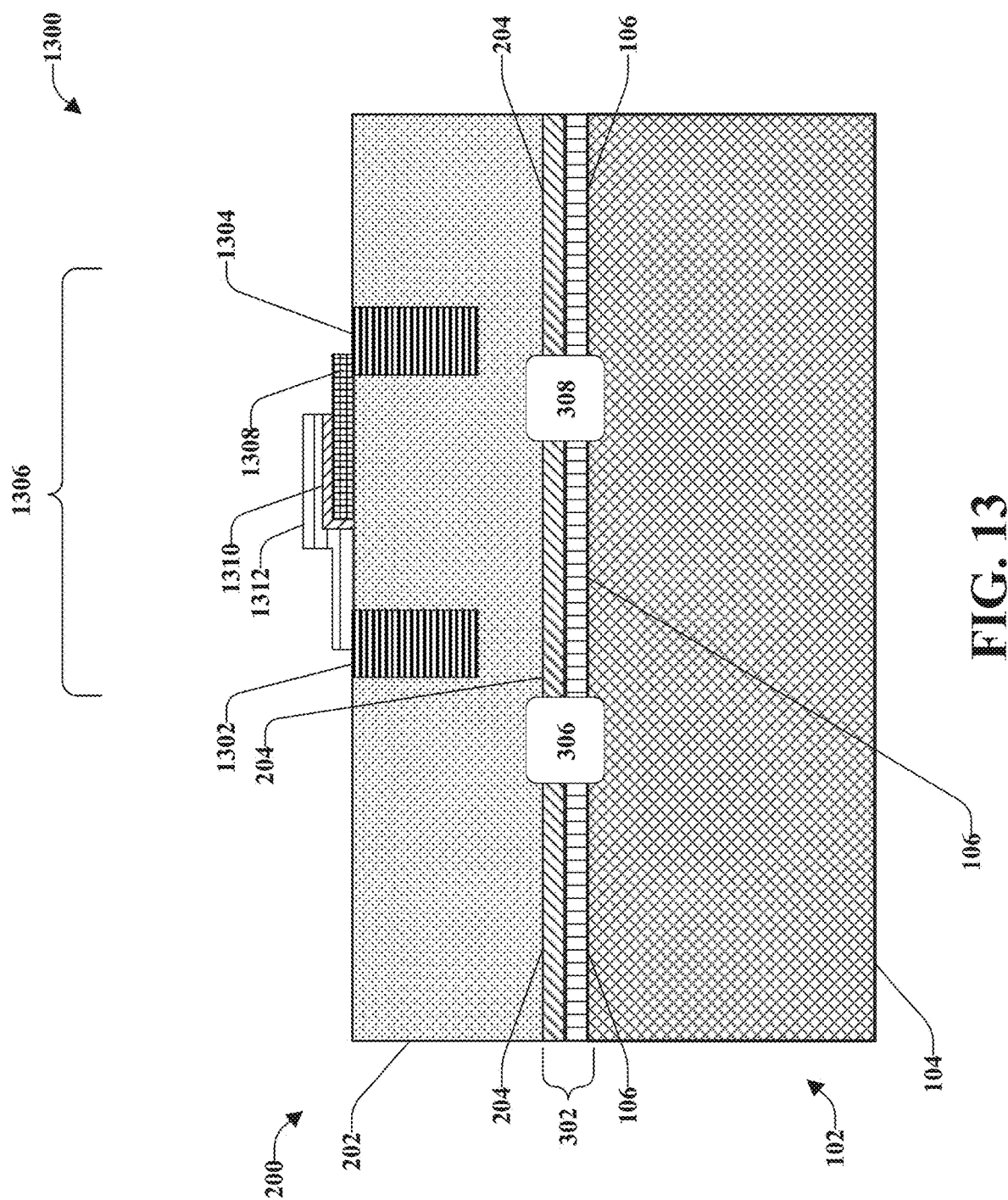
FIG. 13 illustrates an example, non-limiting, side cross-sectional view of a structure for another embodiment of a quantum information device that comprises a transmon with vertical plates in accordance with one or more embodiments described herein.

FIG. 13 illustrates an example, non-limiting, side cross-sectional view of a structure for another embodiment of a quantum information device 1300 that comprises a transmon with vertical plates in accordance with one or more embodiments described herein. Repetitive description of like elements employed in other embodiments described herein is omitted for sake of brevity.

One or more vias, illustrated as a first via 1302 and a second via 1304, can capacitively couple top and bottom substrates at defined locations. As illustrated, the first via 1302 and the second via 1304 can sink deeply into the silicon (e.g., the second crystalline silicon layer 202). The first via 1302 represents a first capacitor pad of a transmon 1306 and the second via 1304 represents the second capacitor pad of the transmon 1306.

Vertical capacitor pads can change the capacitance between the two plates. An advantage of sinking the vias in this matter can be to reduce the footprint of the qubit, since the vias are deep into the silicon as compared to a planar qubit (e.g., the qubit 1202 of FIG. 12). A transmon with vertical plates is suitable for a thicker second crystalline silicon layer.

The vias (e.g., the first via 1302, the second via 1304) can capacitively couple the top and bottom substrates at defined locations. The fabrication follows the same flow as discussed with respect to FIG. 7. In this embodiment, there can be CMP after partial TSV deposition. Then, a planar junction (e.g., the transmon 1306) can be formed on the top surface. The partial TSV can be used as a portion of a transmon to couple to the lower layer (e.g., the buried layer 302).

The transmon 1306 can comprise a first capacitor pad (e.g., the first via 1302), a second capacitor pad (e.g., the second via 1304), a first superconductor contact 1308, a tunnel barrier layer 1310, and a second superconductor contact 1312.

Figure 14:
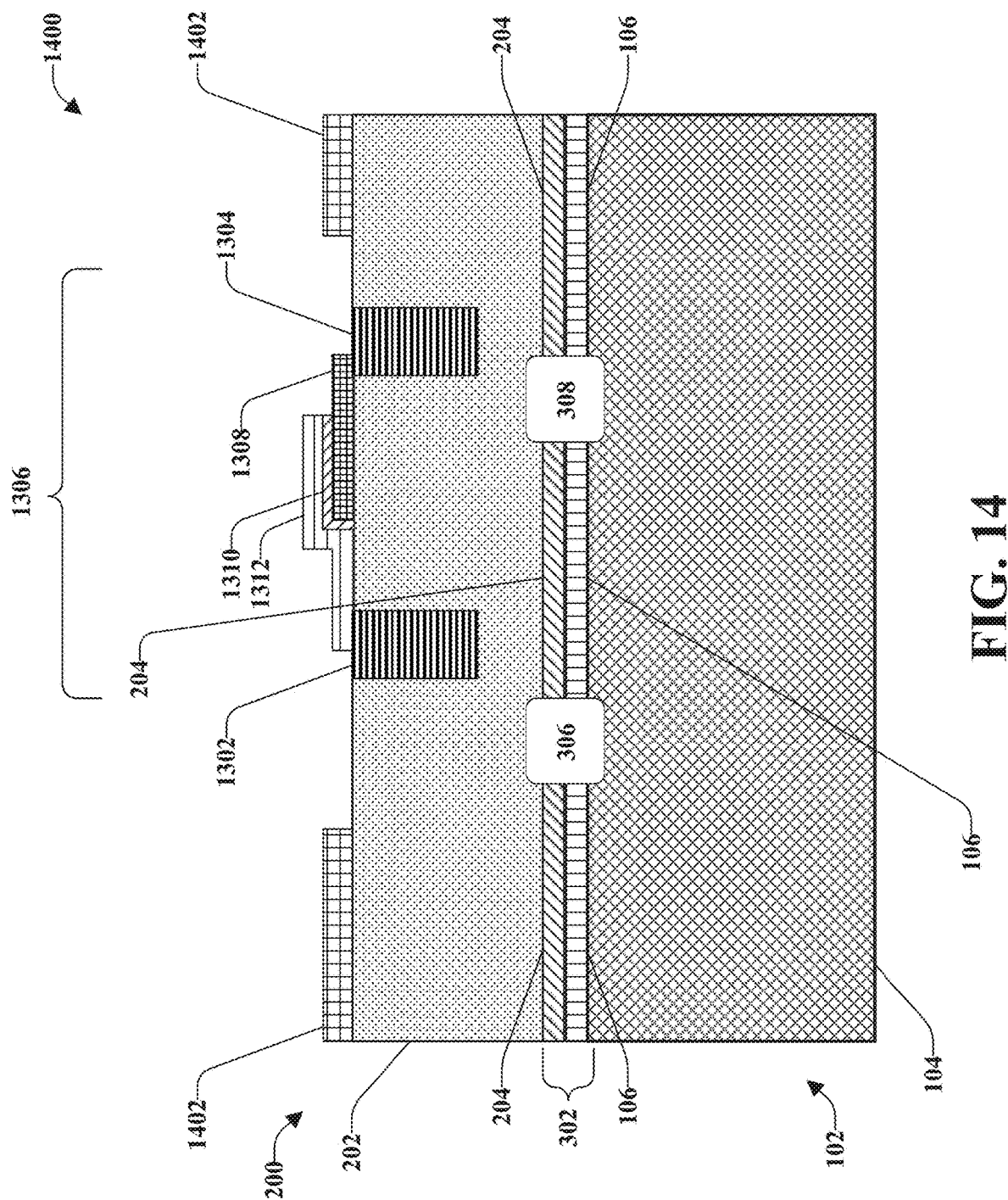
FIG. 14 illustrates an example, non-limiting, side cross-sectional view of a structure for another embodiment of a quantum information device that comprises a transmon with vertical plates in accordance with one or more embodiments described herein.

FIG. 14 illustrates an example, non-limiting, side cross-sectional view of a structure for another embodiment of a quantum information device 1400 that comprises a transmon with vertical plates in accordance with one or more embodiments described herein. Repetitive description of like elements employed in other embodiments described herein is omitted for sake of brevity.

Additional circuitry can be included on a top layer, after CMP and depositing of a superconducting metal 1402. The superconducting metal 1402 can be patterned and etched before the Josephson junction processing. Alternatively, deep trenches can be etched and filled with superconducting metal above the surface. The superconducting metal can be patterned and etched before the Josephson junction processing.

The circuit created on the top layer (e.g., the superconducting metal 1402) can comprise a similar superconducting metal, a same superconducting metal, or a different superconducting metal.

In the embodiment of FIG. 13, the transmon 1306 was created without another circuit on the top layer. For example, the circuit can be in the buried layer 302 and capacitive coupling can be utilized to access the buried layer. In contrast in the embodiment of FIG. 14, there can be circuits in the buried layer and circuits built on the top layer (e.g., the material on the top layer (e.g., the superconducting metal 1402) can be etched and shaped into circuits.

Figure 15:
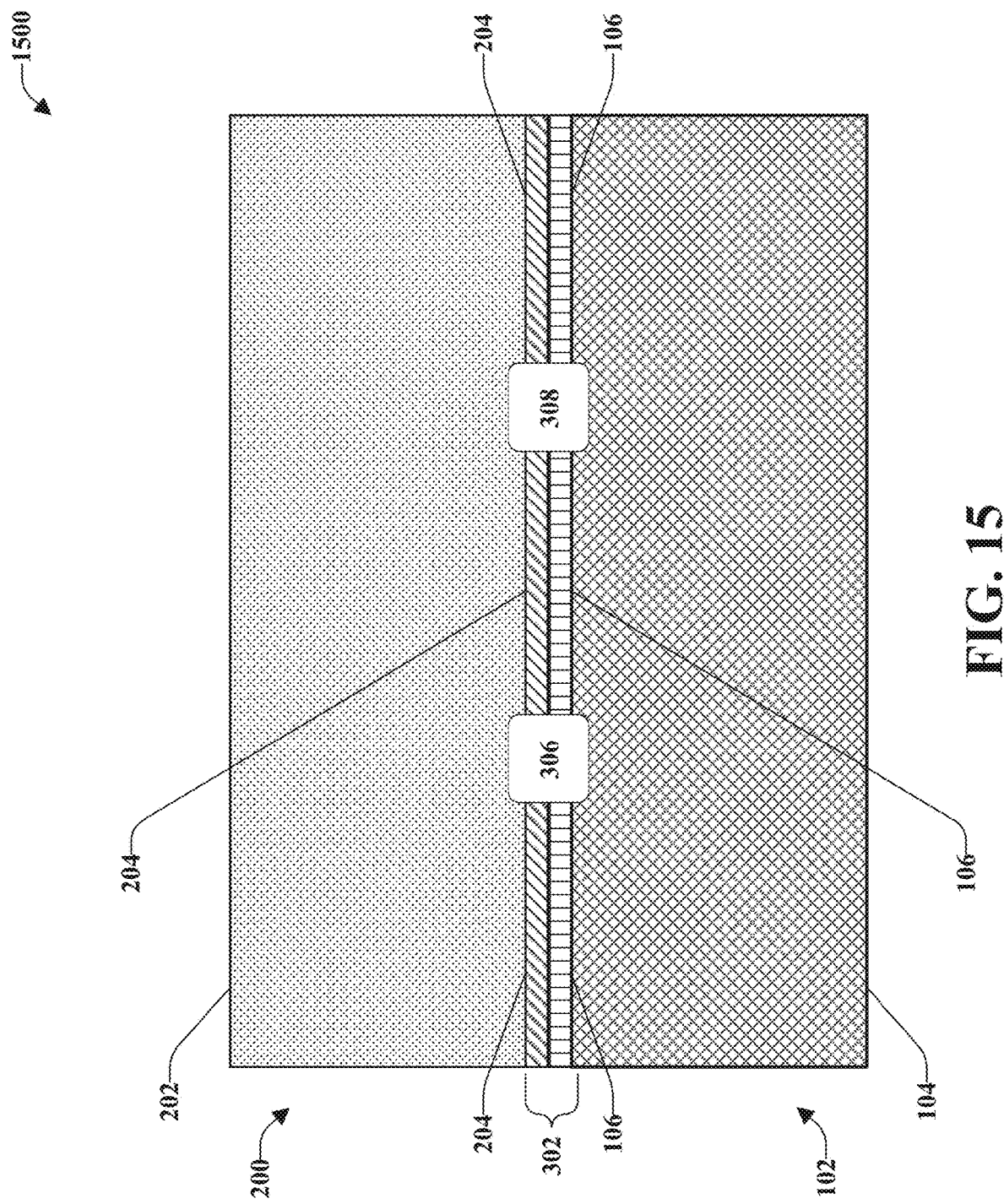
FIG. 15 illustrates an example, non-limiting, side cross-sectional view of a structure for another embodiment of a quantum information device during a fabrication process wherein a top substrate is reduced to a defined height in accordance with one or more embodiments described herein.

FIG. 15 illustrates an example, non-limiting, side cross-sectional view of a structure for another embodiment of a quantum information device 1500 during a fabrication process wherein a top substrate is reduced to a defined height in accordance with one or more embodiments described herein. Repetitive description of like elements employed in other embodiments described herein is omitted for sake of brevity.

As illustrated in FIG. 15, the first wafer 102 and the second wafer can be bonded together. The first wafer 102 and the second wafer 200 have been pre-etched with a first pattern and a second pattern, respectively. The respective patterned portions (e.g., the first patterned superconducting layer 106, the second patterned superconducting layer 204) of the first wafer 102 and the second wafer 200 are bonded together through the application of heat and pressure, for example. The first pattern and the second pattern can be mirrored patterns, the same pattern, similar patterns, different patterns, or combinations thereof.

Figure 16:
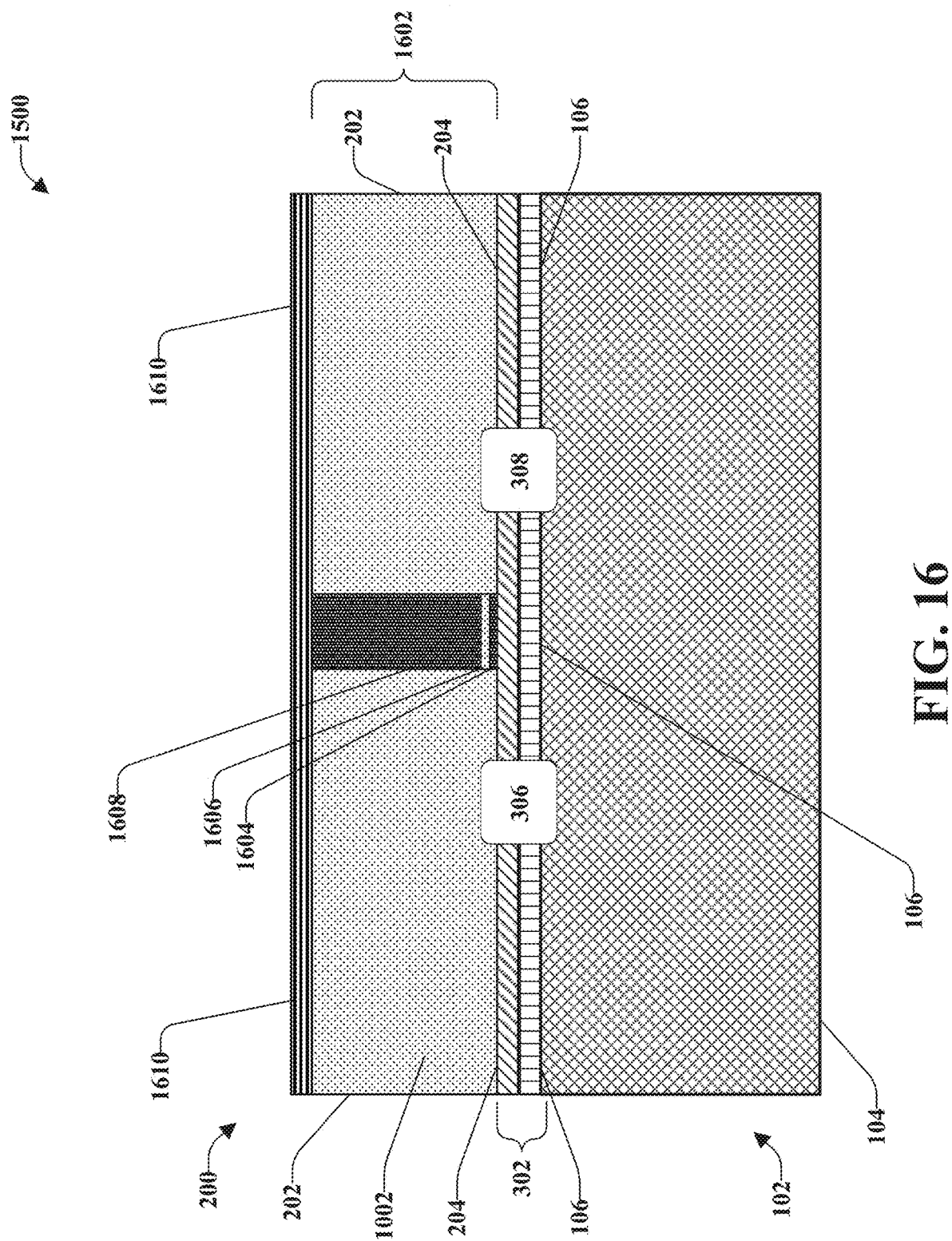
FIG. 16 illustrates an example, non-limiting, side cross-sectional view of the structure of the quantum information device of FIG. 15 during a fabrication process wherein a vertical transmon is processed in accordance with one or more embodiments described herein.

FIG. 16 illustrates an example, non-limiting, side cross-sectional view of the structure of the quantum information device 1500 of FIG. 15 during a fabrication process wherein a vertical transmon is processed in accordance with one or more embodiments described herein. Repetitive description of like elements employed in other embodiments described herein is omitted for sake of brevity.

A top substrate (e.g., the second crystalline silicon layer 202) can be grinded down (e.g., thinned and polished) to the desired height 1602. An etched portion can be created in the silicon (e.g., the second crystalline silicon layer 202) to create a via. A portion of superconducting material 1604 can be deposited at the bottom of the via (e.g., over the second patterned superconducting layer 204). Alternatively, the area of the second patterned superconducting layer 204 that is exposed by the etched portion can be turned into a barrier layer 1606 by oxidation or deposition on the portion of the superconducting material 1604. The remainder of the etched portion can be filled with superconducting metal 1608. Further a top layer 1610 of superconducting material can be deposited across the quantum information device 1500. One or more circuits can be created in the top layer 1610.

An advantage of pre-patterning the first wafer 102 and the second wafer 200 is that there can be one or more circuits in the buried layer, which can be utilized independently of one or more circuits formed on a top layer. Thus, there are two levels of metal that can be utilized for creation of circuits.

Figure 17:
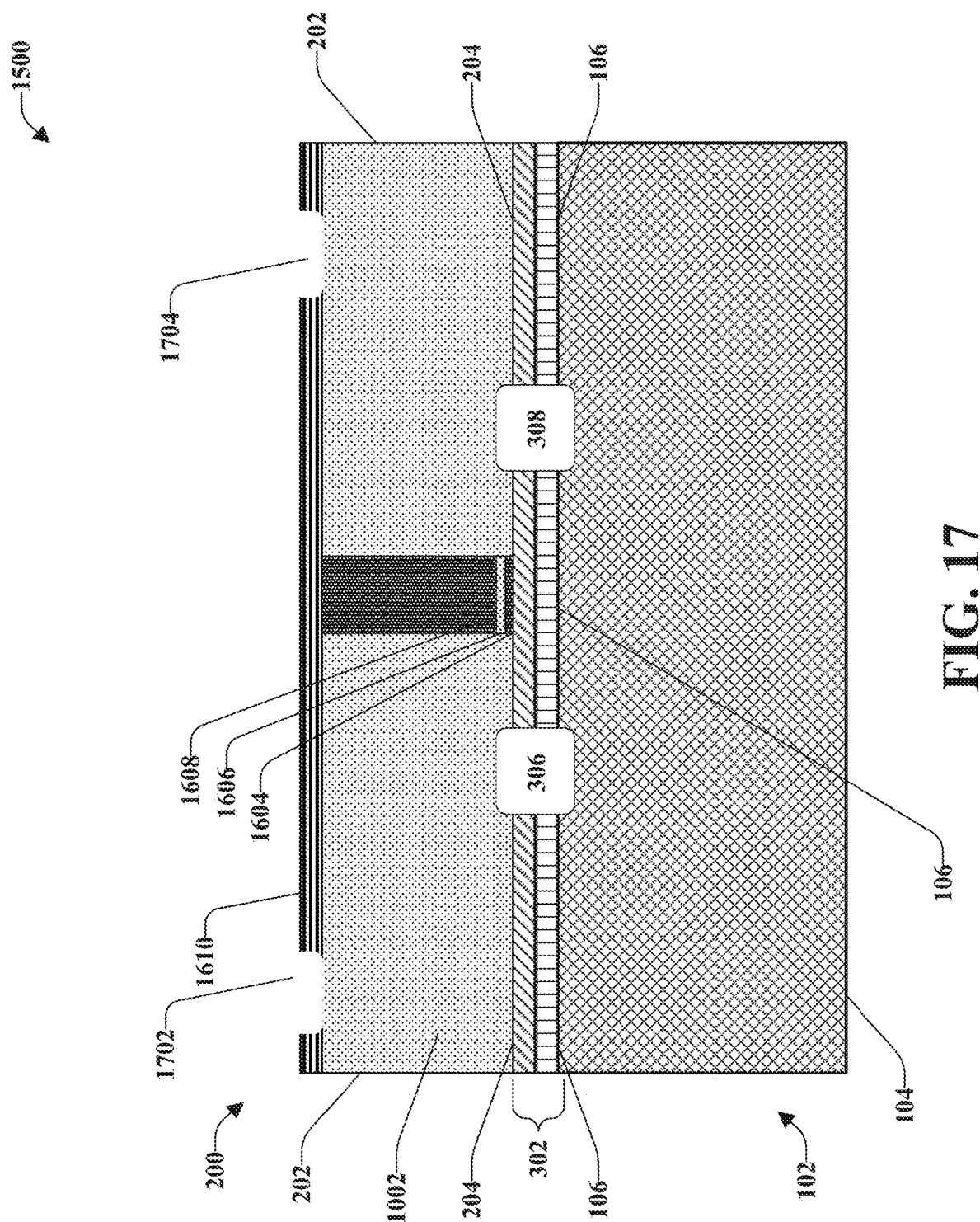
FIG. 17 illustrates an example, non-limiting, side cross-sectional view of the structure of the quantum information device of FIG. 16 during a fabrication process wherein a top surface is patterned in accordance with one or more embodiments described herein.

FIG. 17 illustrates an example, non-limiting, side cross-sectional view of the structure of the quantum information device 1500 of FIG. 16 during a fabrication process wherein a top surface is patterned in accordance with one or more embodiments described herein. Repetitive description of like elements employed in other embodiments described herein is omitted for sake of brevity.

Resonators and other structures can be formed on a top silicon wafer layer and the buried metal layer. For example, as illustrated, etching 1702 and 1704 can be created around the transmon to create an electrically floating qubit. A benefit from the pre-patterning of the buried layer is that there are no holes through the top dielectric (other than for the junctions or vias). There can be different structures on top and bottom metals. Given that in various applications, low critical current is required in the junction, this means the lateral and vertical dimensions of the junction should be small, of order 100 nm, for example. Thus, the top layer should be approximately around 100 nm (~100 nm) in order to use this type of junction. This embodiment still benefits from the pre-patterning of the buried layer, as there are no holes through the top dielectric other than for junctions or vias. The only way to combine with low-coupling between top and bottom layers is to have various levels of etch of the top layer; the area where the qubit is fabricated may be 100 nm thin while other circuitry may reside on 10 um thick Silicon. Then, all structures can be formed with various degrees of coupling between them.

According to some implementations, the superconductor structures discussed herein can comprise a first transmon qubit, which can comprise a planar Josephson junction, and a second transmon qubit that can comprise a vertical Josephson junction.

Figure 18:
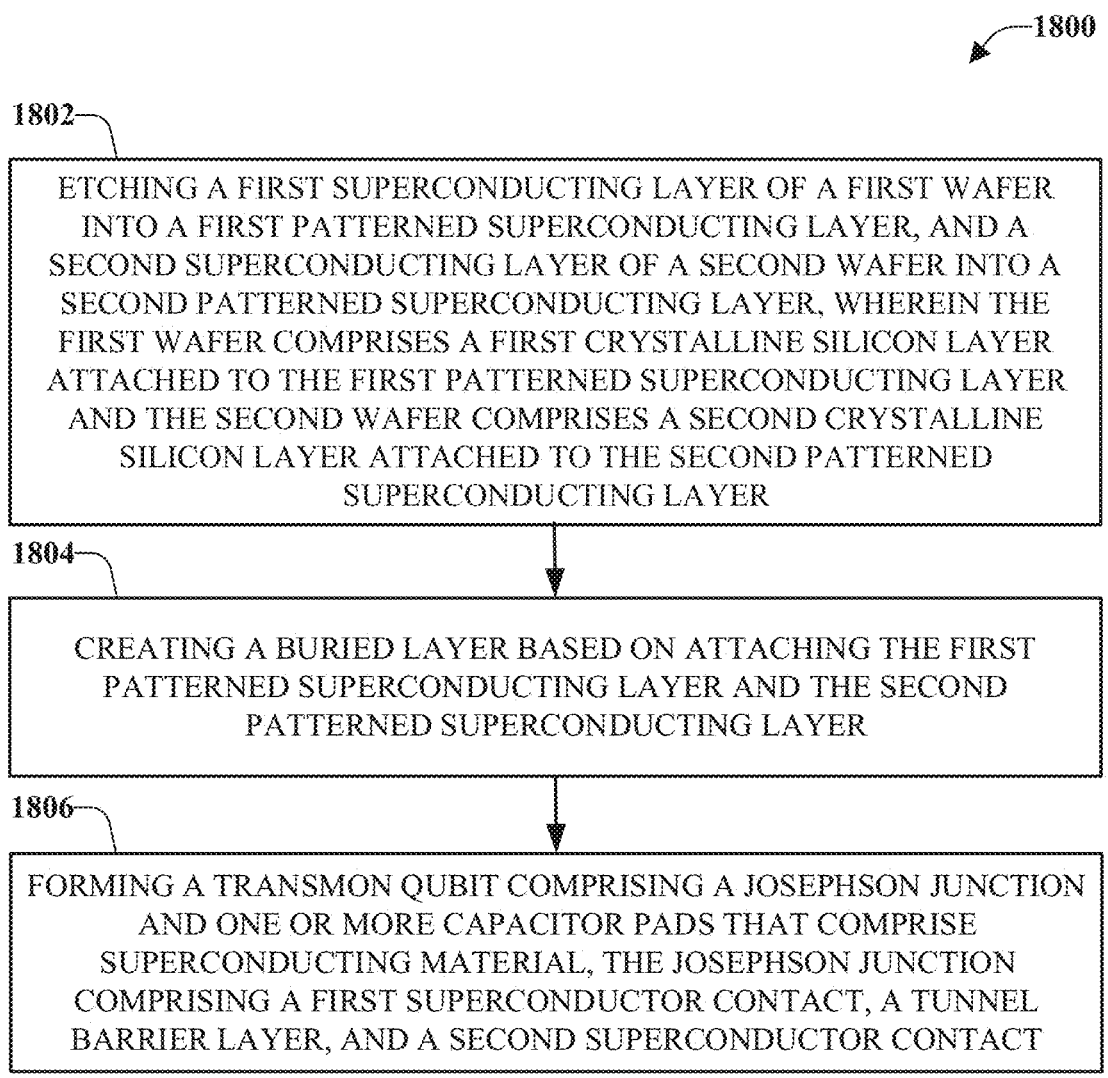
FIG. 18 illustrates a flow diagram of an example, non-limiting, method for fabricating a quantum information device in accordance with one or more embodiments described herein.

FIG. 18 illustrates a flow diagram of an example, non-limiting, method 1800 for fabricating a quantum information device in accordance with one or more embodiments described herein. Repetitive description of like elements employed in other embodiments described herein is omitted for sake of brevity.

At 1802, the method 1800 can comprise etching a first superconducting layer of a first wafer (e.g., the first wafer 102) into a first patterned superconducting layer (e.g., the first patterned superconducting layer 106), and a second superconducting layer of a second wafer (e.g., the second wafer 200) into a second patterned superconducting layer (e.g., the second patterned superconducting layer 204). The first wafer can comprise a first crystalline silicon layer (e.g., the first crystalline silicon layer 104) attached to the first patterned superconducting layer and the second wafer can comprise a second crystalline silicon layer (e.g., the second crystalline silicon layer 202) attached to the second patterned superconducting layer.

Etching the first superconducting layer can comprise etching the first superconducting layer with a first pattern. Further, etching the second superconducting layer can comprise etching the second superconducting layer with a second pattern. In some implementations, the first pattern and the second pattern match (e.g., are mirrored patterns). In accordance with alternative implementations, the first pattern and the second pattern are different patterns. According to other implementations, one or more portions of the first pattern and the second pattern match and other portions (excluding the one or more portions) do not match. Thus, "to match" as used herein means that metal meets metal and non-metal meets non-metal during and after (aligned) bonding.

A buried layer (e.g., the buried layer) can be created, at 1804 of the method 1800, based on attaching the first patterned superconducting layer and the second patterned superconducting layer. For example, heat and pressure can be applied to bond the respective patterned portions of the first wafer and the second wafer together. It is noted that the respective patterns of the first patterned superconducting layer and the second patterned superconducting layer are pre-patterned prior to bonding of the first wafer and the second wafer.

At 1806 of the method 1800, a transmon qubit (e.g., the transmon qubit 600) can be formed. The transmon qubit can comprise a Josephson junction and one or more capacitor pads (e.g., the third section of superconducting metal $502_3$, the fourth section of superconducting metal $502_4$) that comprise superconducting material. The Josephson junction can comprise a first superconductor contact (e.g., the first superconductor contact 602), a tunnel barrier layer (e.g., the tunnel barrier layer 604), and a second superconductor contact (e.g., the second superconductor contact 606).

Figure 19:
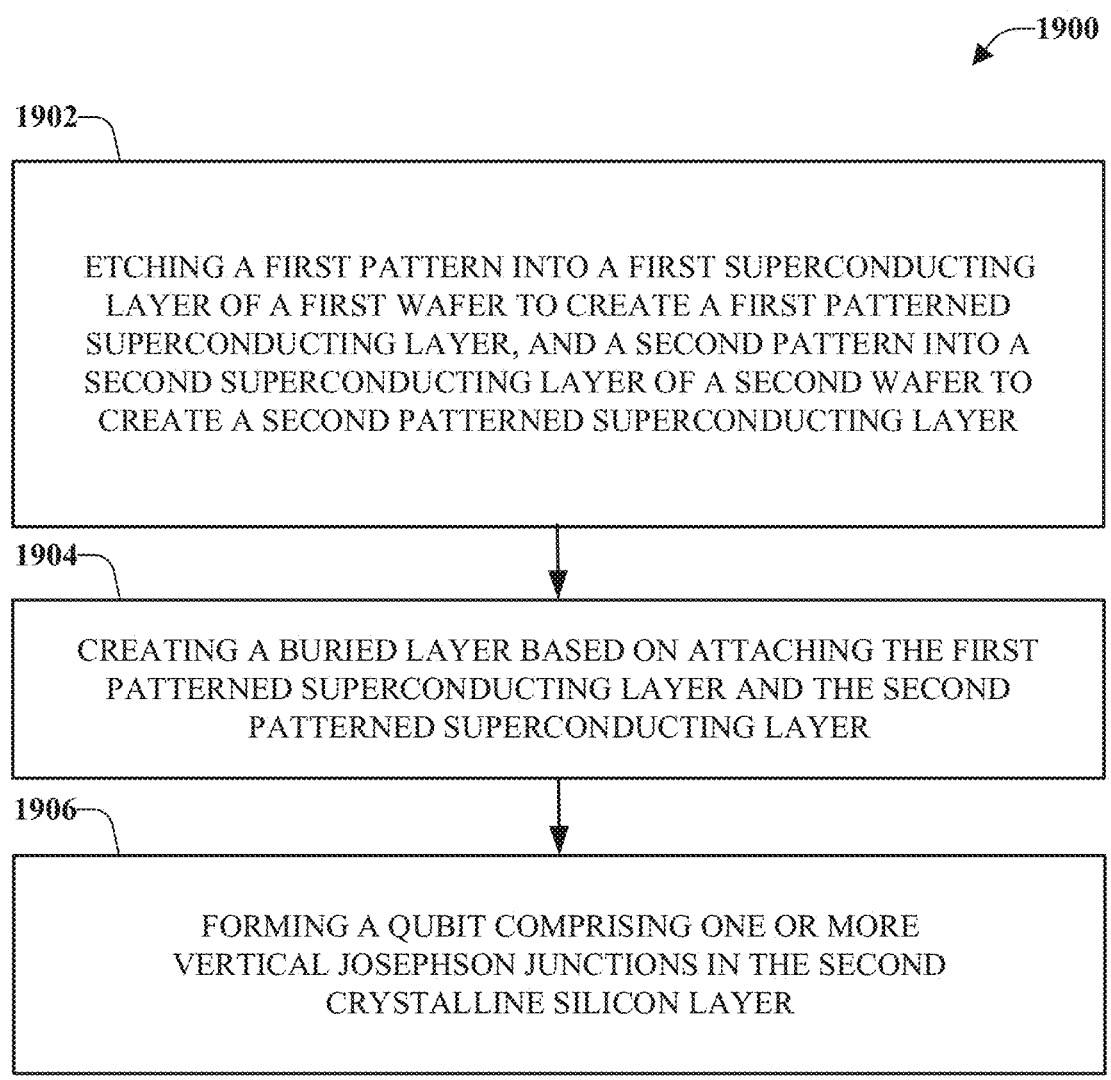
FIG. 19 illustrates a flow diagram of an example, non-limiting, method for fabricating a quantum information device that comprises a transmon qubit that comprises one or more Josephson junctions in accordance with one or more embodiments described herein.

FIG. 19 illustrates a flow diagram of an example, non-limiting, method 1900 for fabricating a quantum information device that comprises a transmon qubit that comprises one or more Josephson junctions in accordance with one or more embodiments described herein. Repetitive description of like elements employed in other embodiments described herein is omitted for sake of brevity.

At 1902 of the method 190 can comprise etching a first pattern into a first superconducting layer of a first wafer (e.g., the first wafer 102) to create a first patterned superconducting layer (e.g., the first patterned superconducting layer 106). Further, a second pattern can be etched into a second superconducting layer of a second wafer (e.g., the second wafer 200) to create a second patterned superconducting layer (e.g., the second patterned superconducting layer 204). The first pattern and the second pattern can be substantially the same pattern (e.g., mirrored patterns), different patterns, or a combination thereof (e.g., a first portion of the first pattern and the second pattern are substantially the same (e.g., mirrored patterns) and a second portion of the first pattern and the second pattern are different patterns). The first wafer can comprise a first crystalline silicon layer (e.g., the first crystalline silicon layer 104) attached to the first patterned superconducting layer and the second wafer can comprise a second crystalline silicon layer (e.g., the second crystalline silicon layer 202) attached to the second patterned superconducting layer.

A buried layer (e.g., the buried layer 302) can be created at 1904 of the method 1900. The buried layer can be created based on an attachment of the first patterned superconducting layer to the second patterned superconducting layer. The buried layer can comprise one or more circuits formed based on the attachment, the first pattern, and the second pattern.

At 1906, a qubit (e.g., the qubit can be formed. The qubit can comprise one or more vertical Josephson junctions in the second crystalline silicon layer. The Josephson junction can comprise a first superconductor contact (e.g., the superconducting material 1604), a tunnel barrier layer (e.g., the barrier layer 1606), and a second superconductor contact (e.g., the superconducting metal 1608).

Figure 20:
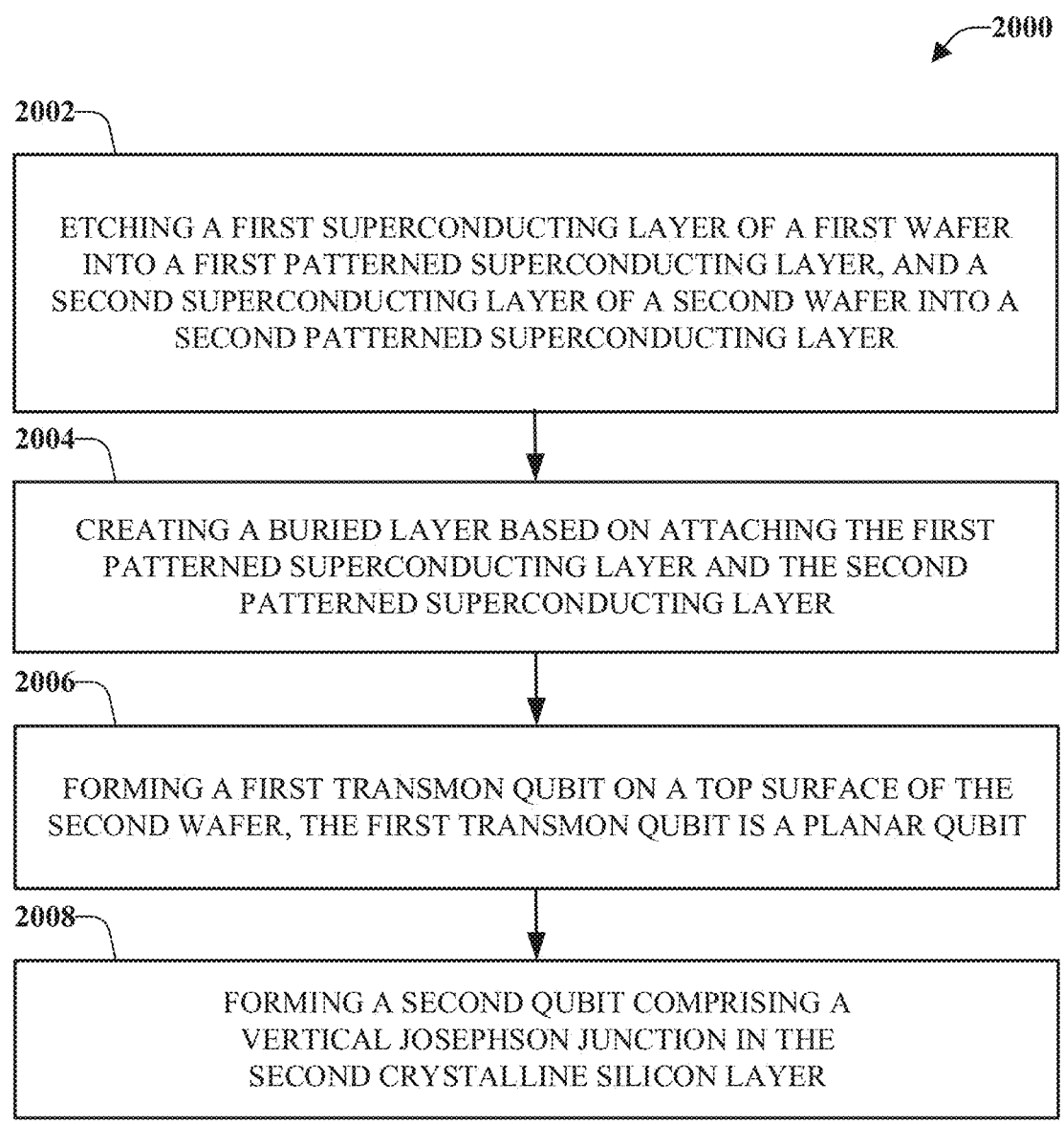
FIG. 20 illustrates a flow diagram of an example, non-limiting, method for fabricating a quantum information device that comprises one or more planar transmon qubits and one or more vertical transmon qubits in accordance with one or more embodiments described herein.

FIG. 20 illustrates a flow diagram of an example, non-limiting, method 2000 for fabricating a quantum information device that comprises one or more planar transmon qubits and one or more vertical transmon qubits in accordance with one or more embodiments described herein. Repetitive description of like elements employed in other embodiments described herein is omitted for sake of brevity.

The method begins, at 2002, with etching a first superconducting layer (e.g., the first crystalline silicon layer 104) of a first wafer (e.g., the first wafer 102) into a first patterned superconducting layer (e.g., the first patterned superconducting layer 106), and etching a second superconducting layer (e.g., the second crystalline silicon layer 202) of a second wafer (e.g., the second wafer 200) into a second patterned superconducting layer (e.g., the second patterned superconducting layer 204).

The first patterned superconducting layer can comprise a first pattern and the second patterned superconducting layer can comprise a second pattern. The first pattern and second pattern can be mirrored patterns, different patterns, or a combination thereof. Further, the first pattern of the first patterned superconducting layer and the second pattern of the second patterned superconducting layer are created (e.g., pre-patterned) prior to bonding of the first wafer and the second wafer.

Further, the first wafer can comprise a first crystalline silicon layer (e.g., the first crystalline silicon layer 104) attached to the first patterned superconducting layer and the second wafer can comprise a second crystalline silicon layer (e.g., the second crystalline silicon layer 202) attached to the second patterned superconducting layer.

At 2004 of the method 2000, a buried layer (e.g., the buried layer 302) can be created based on attaching the first patterned superconducting layer and the second patterned superconducting layer. For example, heat and pressure can be applied to bond the respective patterned portions of the first wafer and the second wafer together.

At 2006 of the method 2000, a first transmon qubit (e.g., the transmon qubit 600) can be formed. The first transmon qubit can comprise a planar Josephson junction and one or more capacitor pads (e.g., the third section of superconducting metal $502_3$, the fourth section of superconducting metal $502_4$, the first via 1302, the second via 1304) that comprise superconducting material. The Josephson junction can comprise a first superconductor contact (e.g., the first superconductor contact 602), a tunnel barrier layer (e.g., the tunnel barrier layer 604), and a second superconductor contact (e.g., the second superconductor contact 606).

Further, at 2008 of the method 2000, a second qubit can be formed. The second qubit can comprise a vertical Josephson junction in the second crystalline silicon layer. The vertical Josephson junction can comprise a third superconductor contact (e.g., the superconducting material 1604), a second tunnel barrier layer (e.g., the barrier layer 1606), and a fourth superconductor contact (e.g., the superconducting metal 1608).

Figure 21:
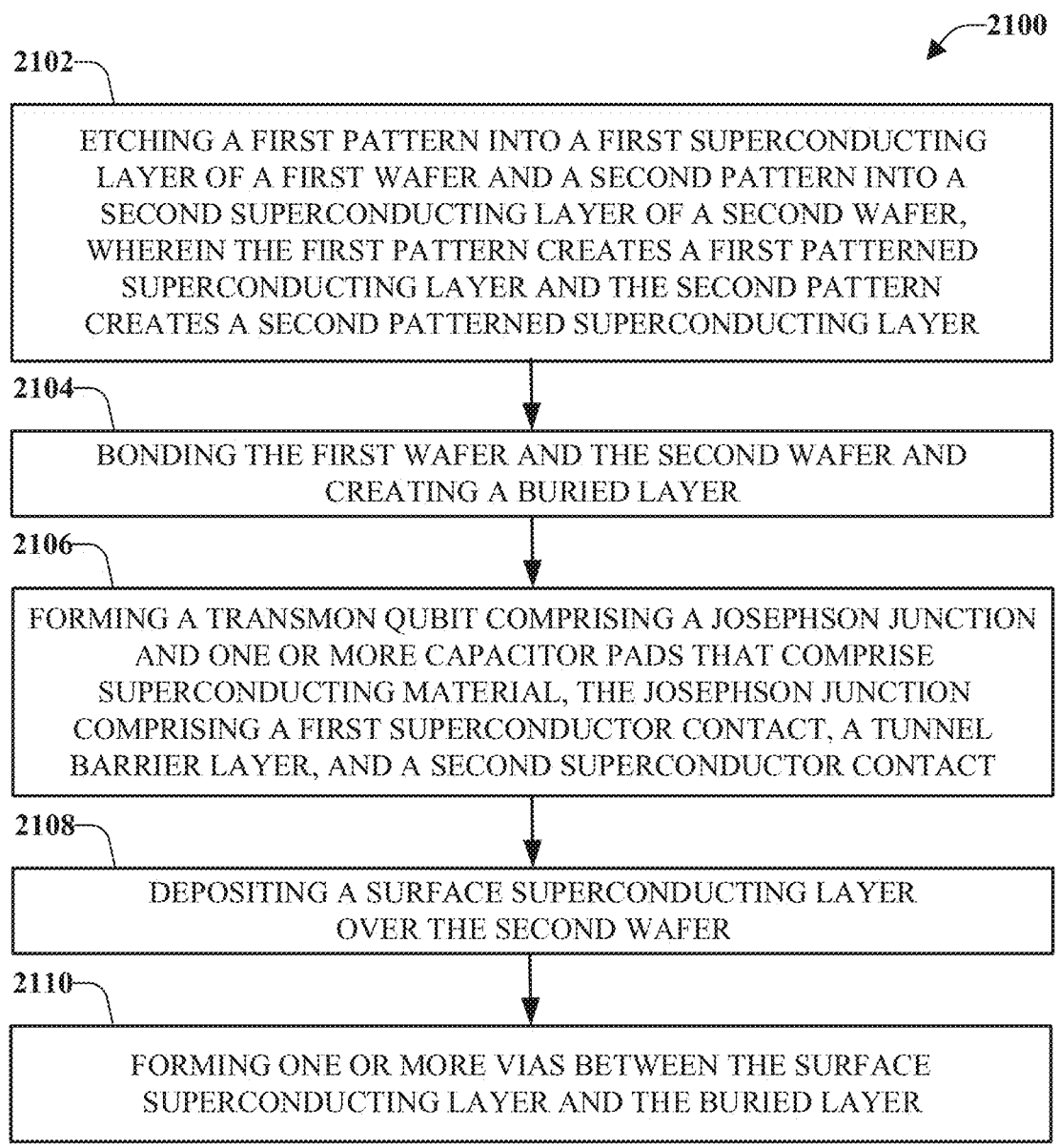
FIG. 21 illustrates a flow diagram of an example, non-limiting, method for fabricating a quantum information device that comprises a through-silicon via in accordance with one or more embodiments described herein.

FIG. 21 illustrates a flow diagram of an example, non-limiting, method 2100 for fabricating a quantum information device that comprises a through-silicon via in accordance with one or more embodiments described herein. Repetitive description of like elements employed in other embodiments described herein is omitted for sake of brevity.

At 2102 of the method 2100 a first pattern can be etched into a first superconducting layer of a first wafer (e.g., the first wafer 102) and a second pattern can be etched into a second superconducting layer of a second wafer (e.g., the second wafer 200). Etching the first pattern can create a first patterned superconducting layer (e.g., the first patterned superconducting layer 106) and etching the second pattern can create a second superconducting layer (e.g., the second patterned superconducting layer 204). The first superconducting layer can be bonded to a first crystalline silicon layer (e.g., the first crystalline silicon layer 104) of the first wafer. Further, the second superconducting layer can be bonded to a second crystalline silicon layer (e.g., the second crystalline silicon layer 202) of the second wafer.

The first wafer and the second wafer can be bonded together and a buried layer (e.g., the buried layer 302) can be created, at 2104 of the method 2100. The bonding of the first wafer and the second wafer can occur after the first pattern and the second pattern are etched. To bond the first wafer and the second wafer, the first patterned superconducting layer and the second patterned superconducting layer can be attached through the application of heat and pressure.

The buried layer can comprise one or more circuits that can be formed based on the first pattern and the second pattern. For example, the first pattern and the second pattern can be mirrored patterns, substantially the same pattern, different patterns, or combinations thereof. Selection of the first pattern and the second pattern can be a function of the one or more circuits that should be included in the buried layer.

The method 2100 continues, at 2106, and a transmon qubit can be formed. The transmon qubit can comprise a Josephson junction and one or more capacitor pads (e.g., the third section of superconducting metal $502_3$, the fourth section of superconducting metal $502_4$) that can comprise superconducting material. The Josephson junction can comprise a first superconductor contact (e.g., the first superconductor contact 602), a tunnel barrier layer (e.g., the tunnel barrier layer 604), and a second superconductor contact (e.g., the second superconductor contact 606).

Further, at 2108, a surface superconducting layer (e.g., the third section of superconducting metal $502_3$, the fourth section of superconducting metal $502_4$) can be deposited over the second wafer. At 2120, one or more vias (e.g., the via 702) can be formed between the surface superconducting layer and the buried layer. The one or more vias can provide a connection between one or more circuits in the buried layer and one or more circuits in the surface conducting layer.

According to an implementation, the second crystalline silicon layer can be a thick crystalline silicon layer and the one or more vias can be through-silicon vias. Through-silicon vias provide less coupling than other vias (e.g., partial vias as discussed with reference to FIG. 8).

Figure 22:
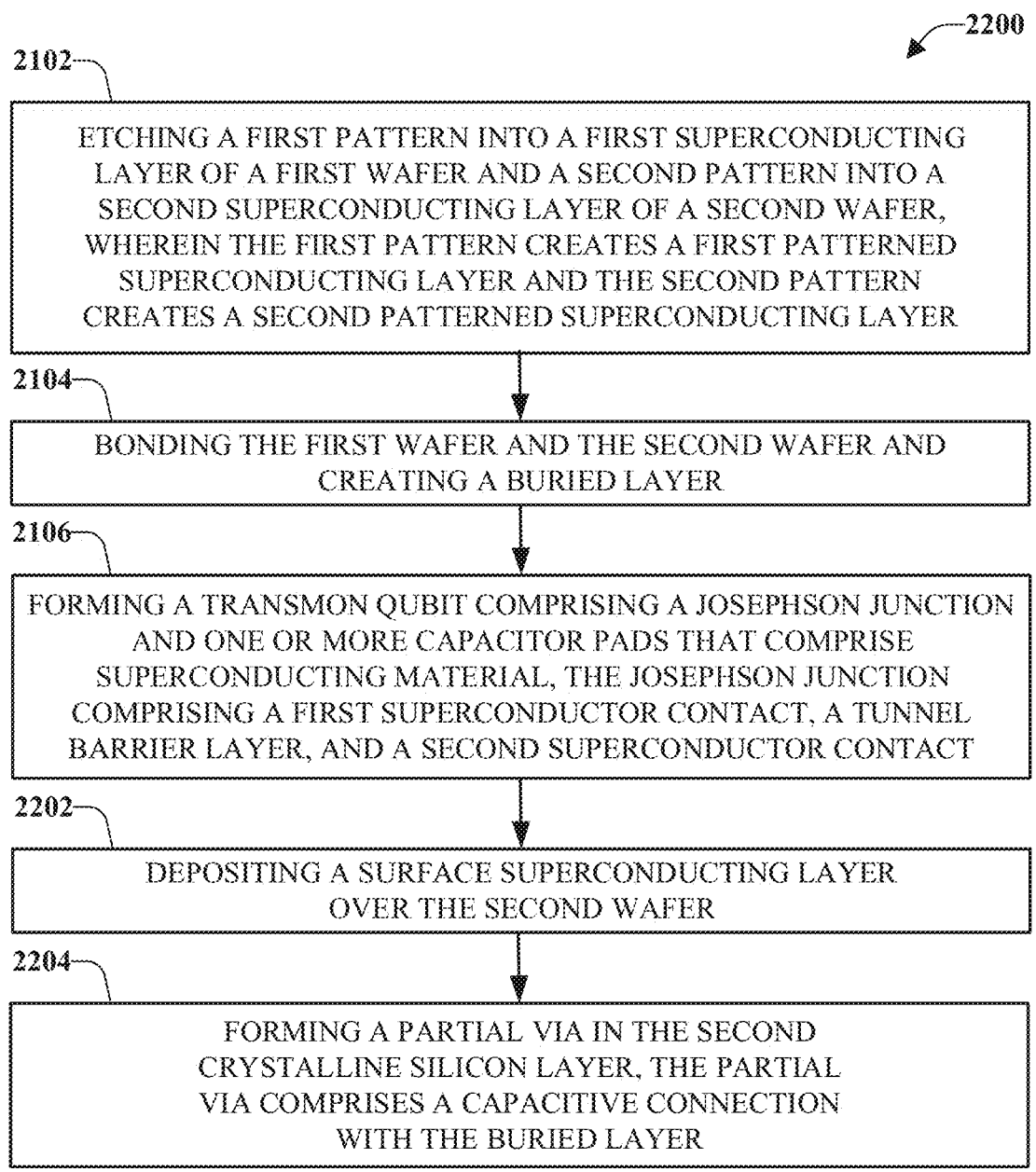
FIG. 22 illustrates a flow diagram of an example, non-limiting, method for fabricating a quantum information device that comprises a partial via in accordance with one or more embodiments described herein.

FIG. 22 illustrates a flow diagram of an example, non-limiting, method 2200 for fabricating a quantum information device that comprises a partial via in accordance with one or more embodiments described herein. Repetitive description of like elements employed in other embodiments described herein is omitted for sake of brevity.

Upon or after the transmon qubit is formed at 2106 of the method 2200, a surface superconducting layer can be deposited over the second wafer, at 2202.

At 2204 one or more vias can be formed in the second crystalline silicon layer. A partial via can comprise a capacitive connection with the second patterned superconducting layer. According to an implementation, the second crystalline silicon layer can be a thin crystalline silicon layer and the one or more vias can be partial vias (e.g., the via 802). Partial vias provide more coupling than other vias (e.g., the through-silicon vias as discussed in FIG. 7). The form the one or more partial vias, the vias can be etched and filled with material.

Figure 23:
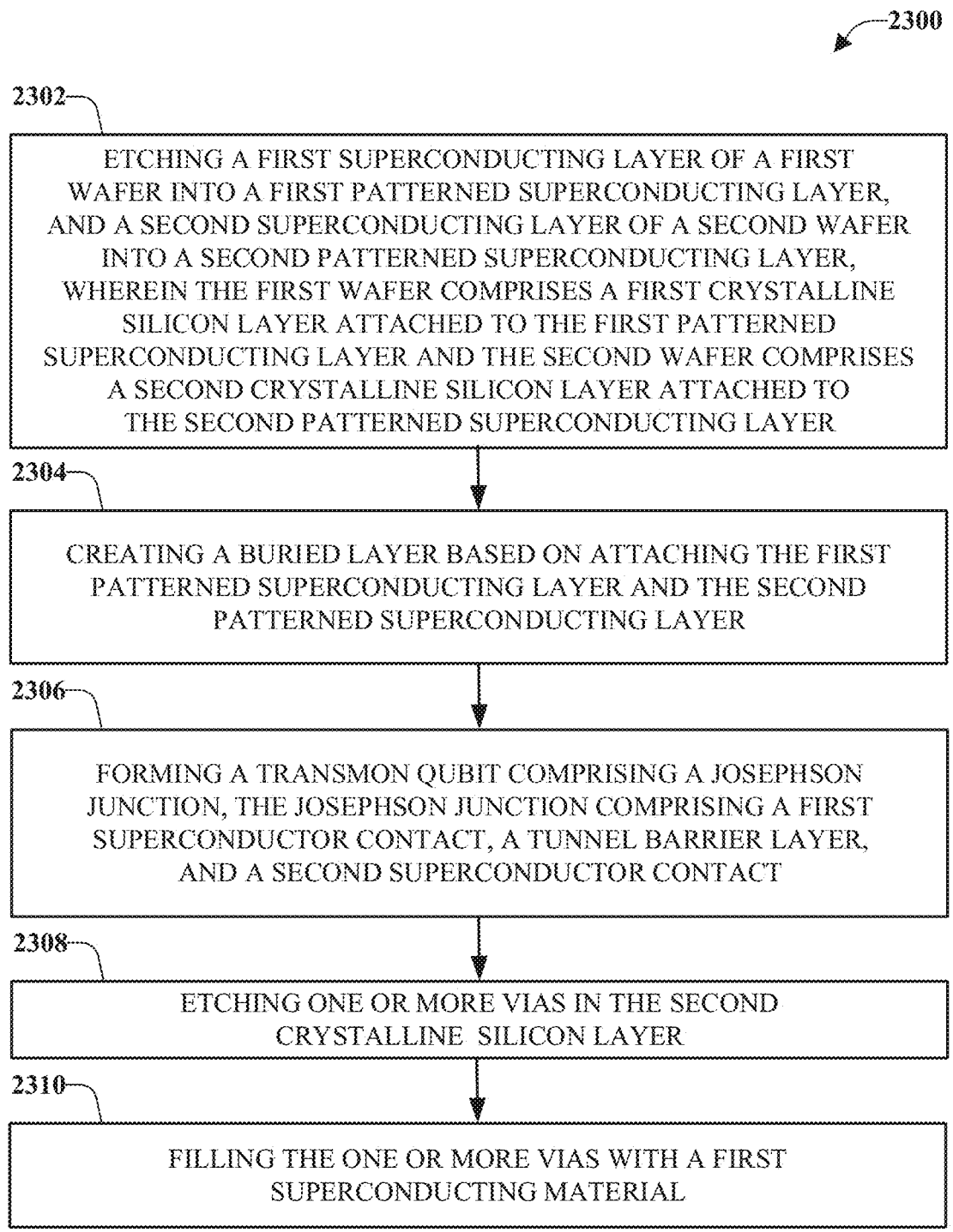
FIG. 23 illustrates a flow diagram of an example, non-limiting, method for fabricating a quantum information device that comprises one or more transmons with vertical plates in accordance with one or more embodiments described herein.

FIG. 23 illustrates a flow diagram of an example, non-limiting, method 2300 for fabricating a quantum information device that comprises one or more transmons with vertical plates in accordance with one or more embodiments described herein. Repetitive description of like elements employed in other embodiments described herein is omitted for sake of brevity.

At 2302, a first superconducting layer of a first wafer (e.g., the first wafer 102) can be etched into a first patterned superconducting layer (e.g., the first patterned superconducting layer 106), and a second superconducting layer of a second wafer (e.g., the second wafer 200) can be etched into a second patterned superconducting layer (e.g., the second patterned superconducting layer 204). The first wafer can comprise a first crystalline silicon layer (e.g., the first crystalline silicon layer 104) attached to the first patterned superconducting layer and the second wafer can comprise a second crystalline silicon layer (e.g., the second crystalline silicon layer 202) attached to the second patterned superconducting layer.

Further, at 2304, a buried layer (e.g., the buried layer 302) can be created based on attaching the first patterned superconducting layer and the second patterned superconducting layer. The buried layer can comprise one or more circuits based on the respective patterns of the first crystalline silicon layer and the second crystalline silicon layer.

A transmon qubit (e.g., the transmon 1306) can be formed, at 2306. The transmon qubit can comprise a Josephson junction. The Josephson junction can comprise a first superconductor contact (e.g., the first superconductor contact 1308), a tunnel barrier layer (e.g., the tunnel barrier layer 1310), and a second superconductor contact (e.g., the second superconductor contact 1312).

At 2308, one or more vias (e.g., the first via 1302, the second via 1304) can be etched in the second crystalline silicon layer. Further, at 2310, the one or more vias can be filled with a first superconducting material. The filled vias and the Josephson junction can create a transmon with vertical plates.

Figure 24:
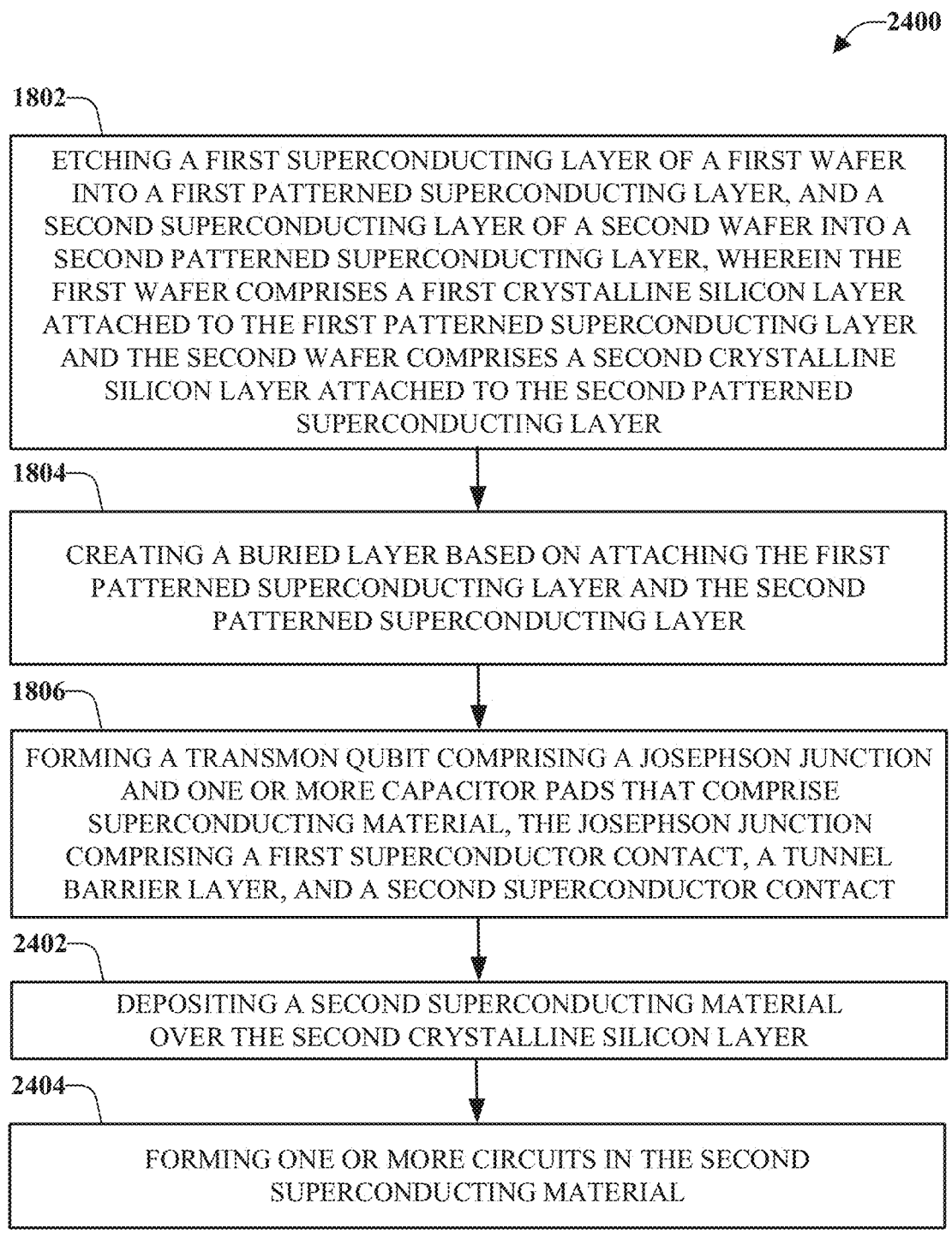
FIG. 24 illustrates a flow diagram of an example, non-limiting, method for fabricating another quantum information device that comprises one or more transmons with vertical plates in accordance with one or more embodiments described herein.

FIG. 24 illustrates a flow diagram of an example, non-limiting, method 2400 for fabricating another quantum information device that comprises one or more transmons with vertical plates in accordance with one or more embodiments described herein. Repetitive description of like elements employed in other embodiments described herein is omitted for sake of brevity.

Upon or after forming the transmon qubit, at 1806, a second superconducting material (e.g., the third section of superconducting metal 502₃, the fourth section of superconducting metal 502₄) can be deposited over the second crystalline silicon layer, at 2402 of the method 2400. One or more control circuits can be formed in the second superconducting material, at 2404 of the method 2400.

Disclosed embodiments and/or aspects should neither be presumed to be exclusive of other disclosed embodiments and/or aspects, nor should a device and/or structure be presumed to be exclusive to its depicted elements in an example embodiment or embodiments of this disclosure, unless where clear from context to the contrary. The scope of the disclosure is generally intended to encompass modifications of depicted embodiments with additions from other depicted embodiments, where suitable, interoperability among or between depicted embodiments, where suitable, as well as addition of a component(s) from one embodiment(s) within another or subtraction of a component(s) from any depicted embodiment, where suitable, aggregation of elements (or embodiments) into a single devices achieving aggregate functionality, where suitable, or distribution of functionality of a single device into multiple device, where suitable. In addition, incorporation, combination or modification of devices or elements depicted herein or modified as stated above with devices, structures, or subsets thereof not explicitly depicted herein but known in the art or made evident to one with ordinary skill in the art through the context disclosed herein are also considered within the scope of the present disclosure.

For simplicity of explanation, the computer-implemented methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts can be required to implement the computer-implemented methodologies in accordance with the disclosed subject matter. In addition, those skilled in the art will understand and appreciate that the computer-implemented methodologies could alternatively be represented as a series of interrelated states via a state diagram or events. Additionally, it should be further appreciated that the computer-implemented methodologies disclosed hereinafter and throughout this specification are capable of being stored on an article of manufacture to facilitate transporting and transferring such computer-implemented methodologies to computers. The term article of manufacture, as used herein, is intended to encompass a computer program accessible from any computer-readable device or storage media.

Figure 25:
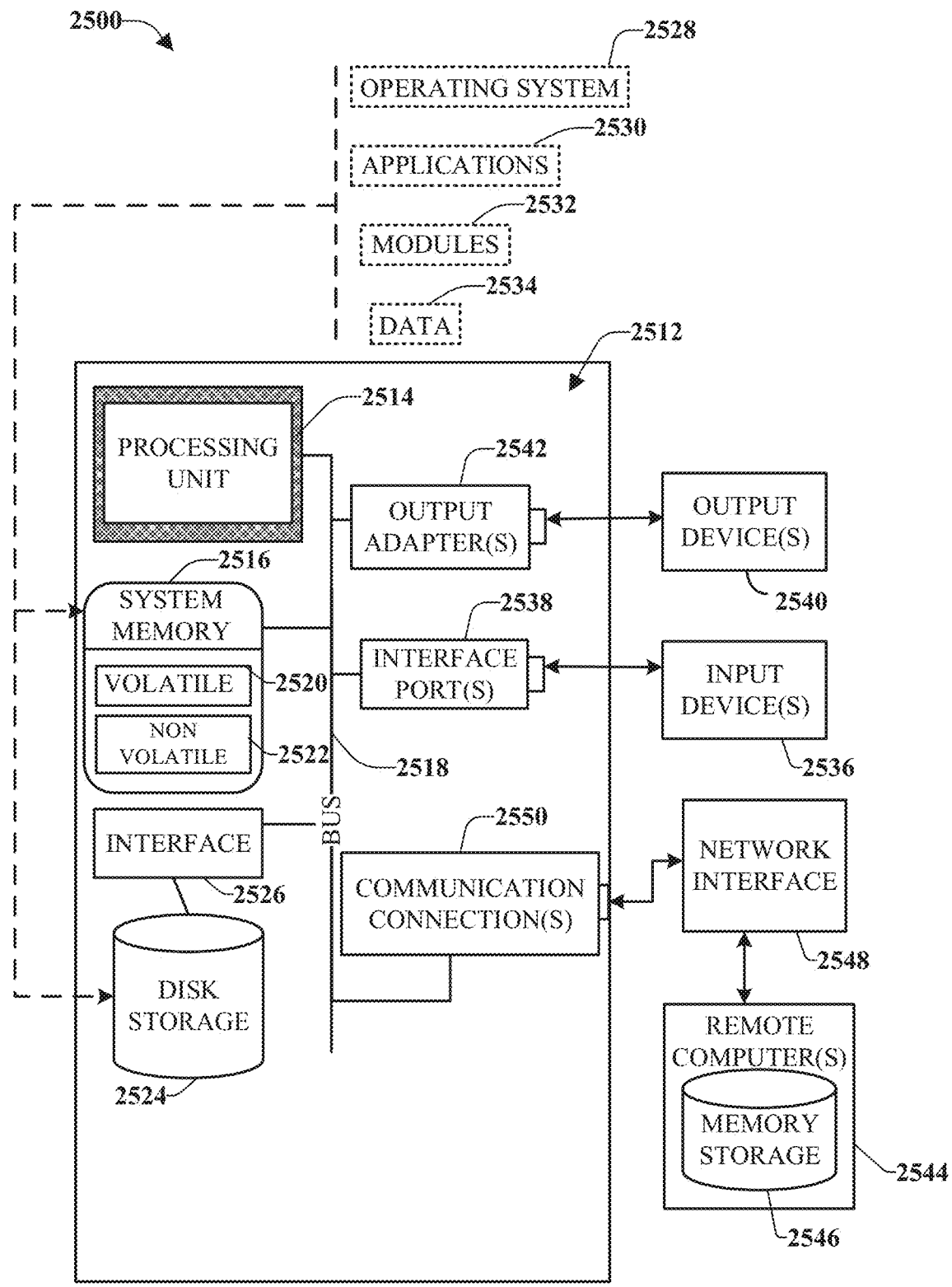
FIG. 25 illustrates a block diagram of an example, non-limiting operating environment in which one or more embodiments described herein can be facilitated.

In order to provide a context for the various aspects of the disclosed subject matter, FIG. 25 as well as the following discussion are intended to provide a general description of a suitable environment in which the various aspects of the disclosed subject matter can be implemented. FIG. 25 illustrates a block diagram of an example, non-limiting operating environment in which one or more embodiments described herein can be facilitated. Repetitive description of like elements employed in other embodiments described herein is omitted for sake of brevity. With reference to FIG. 25, a suitable operating environment 2500 for implementing various aspects of this invention can also include a computer 2512. The computer 2512 can also include a processing unit 2514, a system memory 2516, and a system bus 2518. The system bus 2518 couples system components including, but not limited to, the system memory 2516 to the processing unit 2514. The processing unit 2514 can be any of various available processors. Dual microprocessors and other multiprocessor architectures also can be employed as the processing unit 2514. The system bus 2518 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI). The system memory 2516 can also include volatile memory 2520 and nonvolatile memory 2522. The basic input/output system (BIOS), containing the basic routines to transfer information between elements within the computer 2512, such as during start-up, is stored in nonvolatile memory 2522. By way of illustration, and not limitation, nonvolatile memory 2522 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM)). Volatile memory 2520 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2512 can also include removable/non-removable, volatile/non-volatile computer storage media. FIG. 25 illustrates, for example, a disk storage 2524. Disk storage 2524 can also include, but is not limited to, devices like a magnetic disk drive, floppy disk drive, tape drive, Jaz drive, Zip drive, LS-100 drive, flash memory card, or memory stick. The disk storage 2524 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2524 to the system bus 2518, a removable or non-removable interface is typically used, such as interface 2526. FIG. 25 also depicts software that acts as an intermediary between users and the basic computer resources described in the suitable operating environment 2500. Such software can also include, for example, an operating system 2528. Operating system 2528, which can be stored on disk storage 2524, acts to control and allocate resources of the computer 2512. System applications 2530 take advantage of the management of resources by operating system 2528 through program modules 2532 and program data 2534, e.g., stored either in system memory 2516 or on disk storage 2524. It is to be appreciated that this invention can be implemented with various operating systems or combinations of operating systems. A user enters commands or information into the computer 2512 through input device(s) 2536. Input devices 2536 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 2514 through the system bus 2518 via interface port(s) 2538. Interface port(s) 2538 include, for example, a serial port, a parallel port, a game port, and a universal serial bus (USB). Output device(s) 2540 use some of the same type of ports as input device(s) 2536. Thus, for example, a USB port can be used to provide input to computer 2512, and to output information from computer 2512 to an output device 2540. Output adapter 2542 is provided to illustrate that there are some output devices 2540 like monitors, speakers, and printers, among other output devices 2540, which require special adapters. The output adapters 2542 include, by way of illustration and not limitation, video and sound cards that provide a method of connection between the output device 2540 and the system bus 2518. It should be noted that other devices and/or systems of devices provide both input and output capabilities such as remote computer(s) 2544.

Computer 2512 can operate in a networked environment using logical connections to one or more remote computers, such as remote computer(s) 2544. The remote computer(s) 2544 can be a computer, a server, a router, a network PC, a workstation, a microprocessor based appliance, a peer device or other common network node and the like, and typically can also include many or all of the elements described relative to computer 2512. For purposes of brevity, only a memory storage device 2546 is illustrated with remote computer(s) 2544. Remote computer(s) 2544 is logically connected to computer 2512 through a network interface 2548 and then physically connected via communication connection 2550. Network interface 2548 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 2550 refers to the hardware/software employed to connect the network interface 2548 to the system bus 2518. While communication connection 2550 is shown for illustrative clarity inside computer 2512, it can also be external to computer 2512. The hardware/software for connection to the network interface 2548 can also include, for exemplary purposes only, internal and external technologies such as, modems including regular telephone grade modems, cable modems and DSL modems, ISDN adapters, and Ethernet cards.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create method for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this invention also can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this invention can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other method to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this specification, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this invention, but one of ordinary skill in the art can recognize that many further combinations and permutations of this invention are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A superconductor structure, comprising:
   a buried layer between two wafers comprising crystalline silicon, the buried layer comprising:
      a first patterned superconducting layer,
      a second patterned superconducting layer attached to the first patterned superconducting layer, wherein a first pattern of the first patterned superconducting layer mirrors a second pattern of the second patterned superconducting layer, and the first pattern having a matching mirrored alignment with the second pattern, and
      a circuit based on the first pattern and the second pattern; and
   a transmon qubit, on a wafer of the two wafers, comprising a Josephson junction.

2. The superconductor structure of claim 1, wherein the transmon bit further comprises one or more capacitor pads comprising superconducting material.

3. The superconductor structure of claim 2, wherein the one or more capacitor pads are located on a surface the wafer.

4. The superconductor structure of claim 2, wherein the one or more capacitor pads are filled vias within a crystalline silicon layer of the wafer.

5. The superconductor structure of claim 1, wherein the Josephson junction is a planar Josephson junction.

6. The superconductor structure of claim 1, wherein the Josephson junction is a vertical Josephson junction.

7. The superconductor structure of claim 1, wherein the transmon qubit is a first transmon qubit, the superconductor structure further comprising a second transmon qubit on the wafer, wherein the Josephson junction of the first transmon qubit is a planar Josephson junction and the second transmon qubit comprises a vertical Josephson junction.

8. The superconductor structure of claim 1, further comprising:
   a surface superconducting layer on at least a portion of the wafer; and a through silicon via between the surface superconducting layer and the buried layer.

9. The superconductor structure of claim 1, further comprising:
a surface superconducting layer on at least a portion of the wafer; and
a partial via in a crystalline silicon layer, the partial via comprises a capacitive connection with the buried layer.

10. A method, comprising:
forming a first patterned superconducting layer on a first wafer of a superconductor structure, wherein the first patterned superconducting layer has a first pattern;
forming a second patterned superconducting layer on a second wafer of the superconductor structure, wherein the second patterned superconducting layer has having a second pattern, and the first pattern mirrors the second pattern, and the first wafer and the second wafer comprise crystalline silicon;
creating a buried layer based on attaching the first patterned superconducting layer and the second patterned superconducting layer, wherein the first pattern has a matching mirrored alignment with the second pattern; and
forming a transmon qubit, on the first wafer, comprising a Josephson junction.

11. The method of claim 10, wherein the forming the transmon qubit comprises forming one or more capacitor pads comprising superconducting material.

12. The method of claim 10, wherein the comprises forming the one or more capacitor pads comprising forming the one or more capacitor pads on a surface the first wafer of the superconductor structure.

13. The method of claim 10, wherein the Josephson junction is a planar Josephson junction.

14. The method of claim 10, wherein the Josephson junction is a vertical Josephson junction.

15. The method of claim 10, wherein the transmon qubit is a first transmon qubit, further comprising forming a second transmon qubit on the first wafer of the superconductor structure, wherein the Josephson junction of the first transmon qubit is a planar Josephson junction and the second transmon qubit comprises a vertical Josephson junction.

16. A quantum information device, comprising:
a superconductor structure comprising:
a buried layer between two wafers comprising crystalline silicon, the buried layer comprising:
a first patterned superconducting layer,
a second patterned superconducting layer attached to the first patterned superconducting layer, wherein a first pattern of the first patterned superconducting layer mirrors a second pattern of the second patterned superconducting layer, and the first pattern having a matching mirrored alignment with the second pattern, and
a circuit based on the first pattern and the second pattern; and
a transmon qubit, on a wafer of the two wafers, comprising a Josephson junction.

17. The quantum information device of claim 16, wherein the transmon obit further comprises one or more capacitor pads comprising superconducting material.

18. The quantum information device of claim 16, wherein the Josephson junction is a planar Josephson junction.

19. The quantum information device of claim 16, wherein the Josephson junction is a vertical Josephson junction.

20. The quantum information device of claim 16, wherein the transmon qubit is a first transmon qubit, the superconductor structure further comprising a second transmon qubit on the wafer, wherein the Josephson junction of the first transmon qubit is a planar Josephson junction and the second transmon qubit comprises a vertical Josephson junction.

\* \* \* \* \*